(12) United States Patent
Komai

(10) Patent No.: US 12,044,869 B2
(45) Date of Patent: Jul. 23, 2024

(54) IMAGE SENSOR AND ELECTRONIC CAMERA

(71) Applicant: NIKON CORPORATION, Tokyo (JP)

(72) Inventor: Atsushi Komai, Tokorozawa (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 17/511,072

(22) Filed: Oct. 26, 2021

(65) Prior Publication Data

US 2022/0075104 A1 Mar. 10, 2022

Related U.S. Application Data

(63) Continuation of application No. 16/332,419, filed as application No. PCT/JP2017/035019 on Sep. 27, 2017, now Pat. No. 11,181,671.

(30) Foreign Application Priority Data

Sep. 29, 2016 (JP) .................................. 2016-192249
Mar. 27, 2017 (JP) .................................. 2017-061131

(51) Int. Cl.
*G02B 5/20* (2006.01)
*H01L 27/146* (2006.01)
(Continued)

(52) U.S. Cl.
CPC ............... *G02B 5/20* (2013.01); *G02B 5/201* (2013.01); *H01L 27/146* (2013.01);
(Continued)

(58) Field of Classification Search
CPC ...... H04N 5/347; H04N 5/374; H04N 5/3745; H04N 9/04551; H04N 9/04557;
(Continued)

(56) References Cited

U.S. PATENT DOCUMENTS 6,452,153 B1 * 9/2002 Lauxtermann ..... H04N 5/37457
348/E3.02
7,777,171 B2 * 8/2010 Parks ..................... H04N 25/77
348/308
(Continued)

FOREIGN PATENT DOCUMENTS

CN 105594198 A 5/2016
JP 2001-333329 A 11/2001
(Continued)

OTHER PUBLICATIONS

Aug. 31, 2021 Office Action issued in Japanese Patent Application No. 2018-542663.
(Continued)

*Primary Examiner* — Lin Ye
*Assistant Examiner* — Chriss S Yoder, III
(74) *Attorney, Agent, or Firm* — Oliff PLC

(57) ABSTRACT

An image sensor includes: a plurality of filter units, transmission wavelengths of which can be adjusted; a plurality of photoelectric conversion units that receive light transmitted through the filter unit; and a control unit that alters a size of a first region containing a first filter unit, among the plurality of filter units, through which light at a first wavelength is transmitted before entering a photoelectric conversion unit.

8 Claims, 21 Drawing Sheets

(51) Int. Cl.
*H04N 23/84* (2023.01)
*H04N 25/13* (2023.01)
*H04N 25/46* (2023.01)
*H04N 25/77* (2023.01)
*H04N 23/12* (2023.01)
*H04N 25/76* (2023.01)

(52) U.S. Cl.
CPC .. *H01L 27/14621* (2013.01); *H01L 27/14645* (2013.01); *H04N 23/84* (2023.01); *H04N 25/13* (2023.01); *H04N 25/134* (2023.01); *H04N 25/77* (2023.01); *H04N 23/12* (2023.01); *H04N 25/46* (2023.01); *H04N 25/76* (2023.01)

(58) Field of Classification Search
CPC .......... H04N 9/07; H04N 23/10; H04N 23/12; H04N 23/84; H04N 25/13; H04N 25/134; H04N 25/46; H04N 25/702; H04N 25/76; H04N 25/77; H01L 27/146; H01L 27/14621; H01L 27/14623; H01L 27/1464; H01L 27/14645; G02B 5/20; G02B 5/201
See application file for complete search history.

(56) References Cited

U.S. PATENT DOCUMENTS

| | | |
|---|---|---|
| 10,120,182 B2 | 11/2018 | Borthakur et al. |
| 2002/0012064 A1 | 1/2002 | Yamaguchi |
| 2009/0086064 A1 | 4/2009 | Mackey |
| 2010/0051784 A1 | 3/2010 | Parks |
| 2010/0182465 A1 | 7/2010 | Okita |
| 2011/0101205 A1* | 5/2011 | Tian ................. H04N 5/357 250/208.1 |
| 2012/0139825 A1 | 6/2012 | Yashiro et al. |
| 2012/0328100 A1 | 12/2012 | Hirota |
| 2013/0248939 A1 | 9/2013 | Sakai et al. |
| 2014/0232912 A1* | 8/2014 | Morimoto ............ G02F 1/136 348/270 |
| 2014/0232913 A1 | 8/2014 | Sakane |
| 2015/0085170 A1 | 3/2015 | Takeda |
| 2016/0071893 A1 | 3/2016 | Shinohara |
| 2016/0205336 A1 | 7/2016 | Sato et al. |
| 2016/0219232 A1 | 7/2016 | Murata |
| 2017/0171470 A1 | 6/2017 | Sakioka et al. |

FOREIGN PATENT DOCUMENTS

| | | |
|---|---|---|
| JP | 2010-193437 A | 9/2010 |
| JP | 2012-085028 A | 4/2012 |
| JP | 2012-137737 A | 7/2012 |
| JP | 2013-85028 A | 5/2013 |
| JP | 2013-197951 A | 9/2013 |
| JP | 2014-232900 A | 12/2014 |
| JP | 2015-065271 A | 4/2015 |
| JP | 2016-052041 A | 4/2016 |
| JP | 2016-058818 A | 4/2016 |
| JP | 2016-131363 A | 7/2016 |
| WO | 2016/089551 A1 | 6/2016 |

OTHER PUBLICATIONS

Jan. 13, 2021 Office Action issued in Chinese Patent Application No. 201780073453.9.
Hirano et al., "Novel-Design Full-Color Electric Display Technology," Ricoh Technical Report No. 38, Dec. 2012, pp. 22-29.
Dec. 12, 2017 International Search Report issued in International Patent Application No. PCT/JP2017/035019.
Feb. 4, 2021 Office Action issued in U.S. Appl. No. 16/322,419.
Jul. 22, 2021 Notice of Allowance issued in U.S. Appl. No. 16/332,419.
Sep. 28, 2021 Corrected Notice of Allowability issued in U.S. Appl. No. 16/332,419.
Oct. 18, 2022 Decision of Dismissal of Amendment issued in Japanese Patent Application No. 2018-542663.
Feb. 8, 2022 Office Action issued in Japanese Patent Application No. 2018-542663.
Aug. 8, 2023 Office Action issued in Chinese Patent Application No. 202111405022.2.

* cited by examiner

IMAGE SENSOR AND ELECTRONIC CAMERA

CROSS-REFERENCE TO RELATED APPLICATIONS

This is a Continuation of application Ser. No. 16/332,419 filed Jul. 17, 2019 (now U.S. Pat. No. 11,181,671), which in turn is a National Phase of PCT Application No. PCT/JP2017/035019 filed Sep. 27, 2019, which claims the benefit of Japanese Patent Application No. 2016-192249 filed Sep. 29, 2016 and Japanese Patent Application No 2017-061131 filed Mar. 27, 2017. The disclosure of the prior applications is hereby incorporated by reference herein in its entirety.

TECHNICAL FIELD

The present invention relates to an image sensor and an electronic camera.

There is an image sensor known in the related art that includes pixels each having a variable filter the transmission wavelength of which can be adjusted (PTL 1). There is an issue yet to be addressed in the image sensor in the related art in that the resolution cannot be altered.

CITATION LIST

Patent Literature

PTL 1: Japanese Laid Open Patent Publication No. 2013-85028

SUMMARY OF INVENTION

According to the 1st aspect of the present invention, an image sensor comprises: a plurality of filter units, transmission wavelengths of which can be adjusted; a plurality of photoelectric conversion units that receive light transmitted through the filter unit; and a control unit that alters a size of a first region containing a first filter unit, among the plurality of filter units, through which light at a first wavelength is transmitted before entering a photoelectric conversion unit.

According to the 2nd aspect of the present invention, an electronic camera comprises: the image sensor according to the 1st aspect; and an image generation unit that generates image data based upon a signal provided by the image sensor.

FIRST EMBODIMENT

Figure 1:
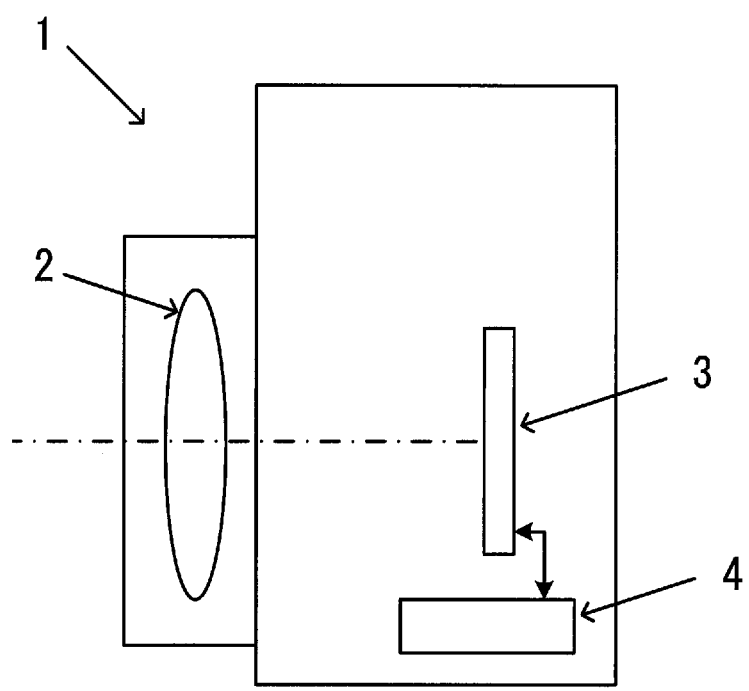
FIG. 1 A block diagram showing the structure of the image capturing device in a first embodiment FIG. 2 A block diagram showing the structure adopted in the image sensor in the first embodiment in an abridged presentation FIG. 3 Diagrams illustrating the structure of the image sensor in the first embodiment in a sectional view FIG. 4 A diagram showing how transmission wavelengths may be selected at the filter units in the first embodiment FIG. 5 Diagrams illustrating how the transmission wavelengths may be adjusted at the filter units in the first embodiment FIG. 6 Diagrams illustrating how the filter units may be controlled in the first embodiment FIG. 7 A circuit diagram showing the structure adopted in a pixel in the first embodiment FIG. 8 A circuit diagram showing the structure adopted in part of the image sensor in the first embodiment FIG. 9 Diagrams in reference to which an example of an operation that may be executed in the image sensor in the first embodiment will be explained FIG. 10 Diagrams in reference to which another example of an operation that may be executed in the image sensor in the first embodiment will be explained FIG. 11 Diagrams in reference to which yet another example of an operation that may be executed in the image sensor in the first embodiment will be explained FIG. 12 Diagrams in reference to which an electronic zoom function of the image capturing device in a second embodiment will be explained FIG. 13 A circuit diagram showing the structure adopted in part of the image sensor in the variation 1

FIG. 1 is a block diagram showing the structure of the image capturing device in the first embodiment. The image-capturing device in the first embodiment may be an electronic camera 1 adopting a structure such as that shown in FIG. 1. The electronic camera 1 comprises a photographic optical system 2, an image sensor 3 and a control unit 4. The photographic optical system 2 forms a subject image at the image sensor 3. The image sensor 3 generates pixel signals by capturing the subject image formed by the photographic optical system 2. The image sensor 3 may be, for instance, a CMOS image sensor. The control unit 4 outputs control signals to the image sensor 3 so as to control operations of the image sensor 3. In addition, the control unit 4 functions as an image generation unit that generates image data by executing various types of image processing on the pixel signals output from the image sensor 3. It is to be noted that the photographic optical system 2 may be an interchangeable system that can be mounted at and dismounted from the electronic camera 1.

Figure 2:
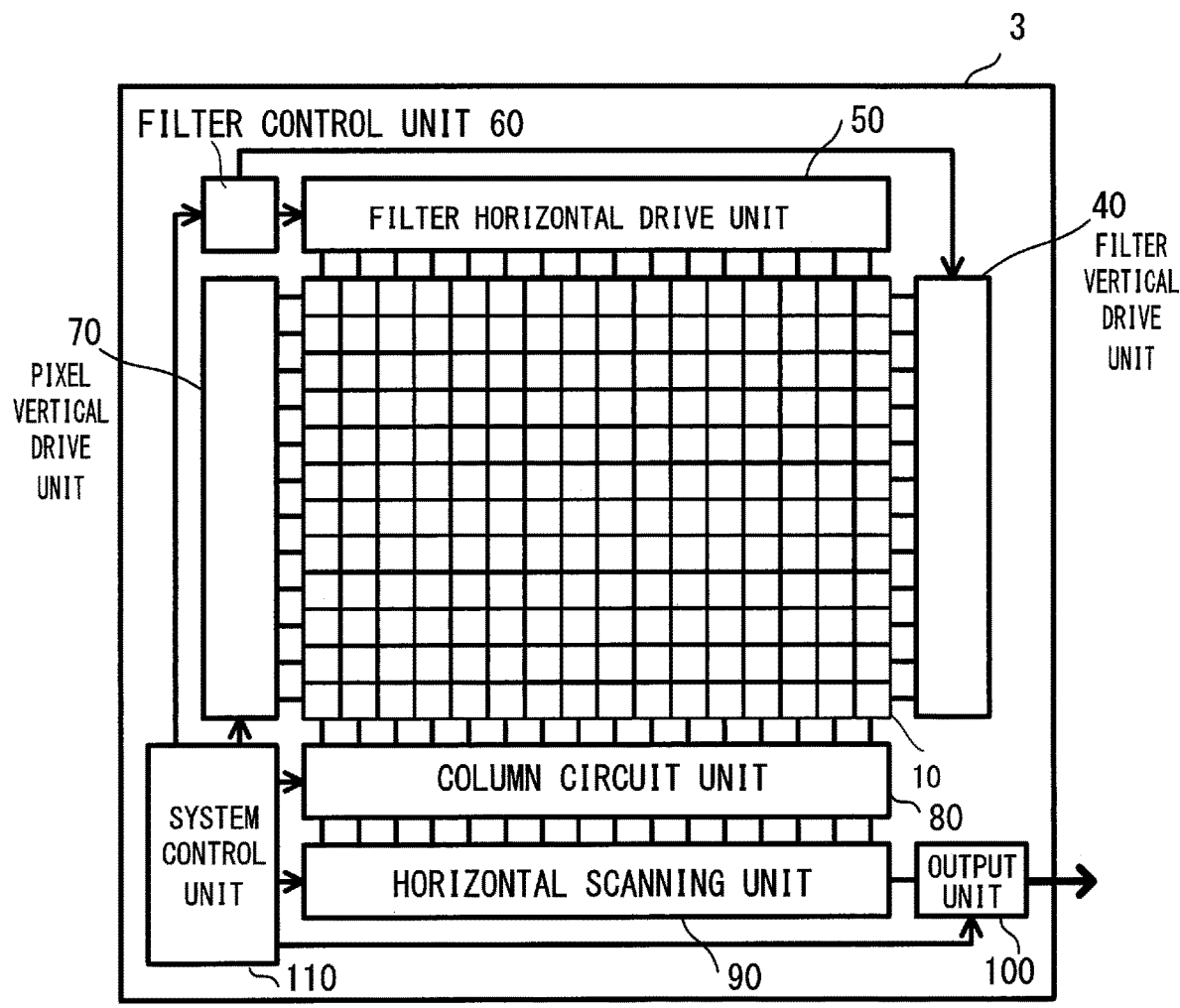
Figure 3:
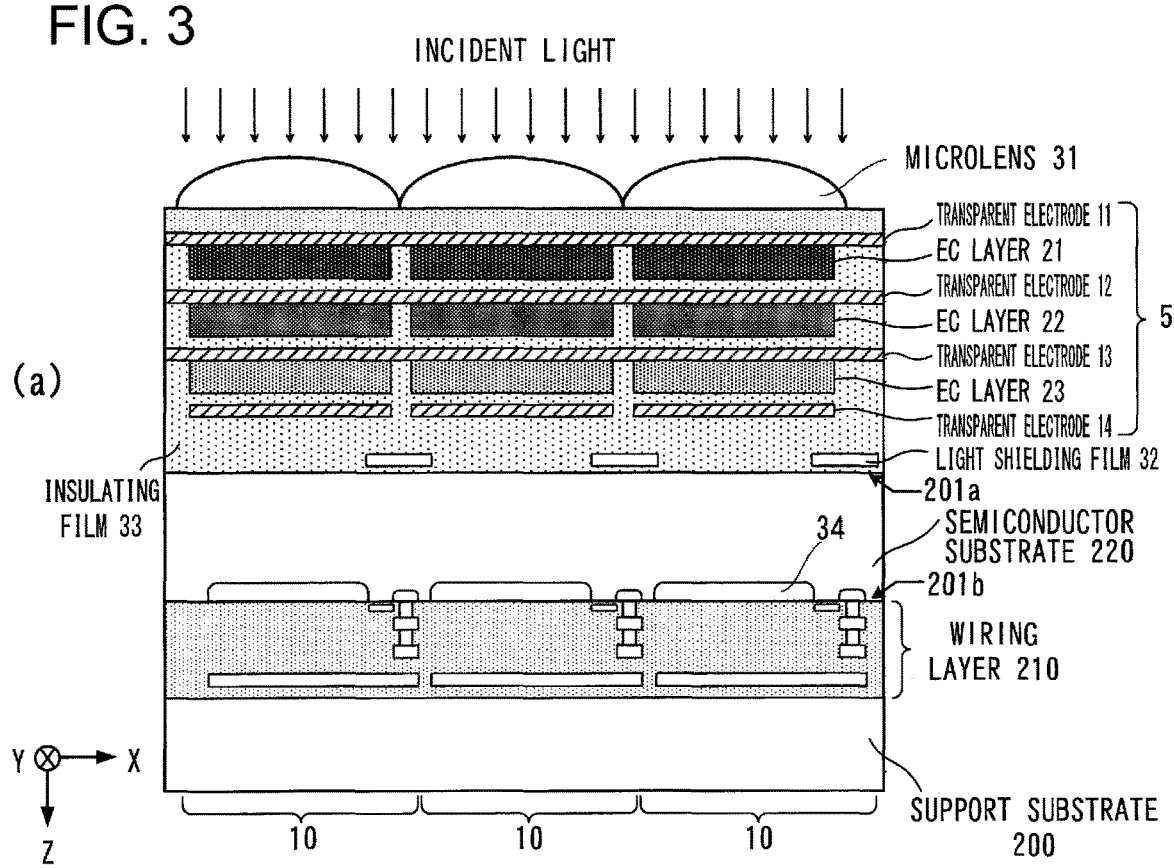
Figure 3:
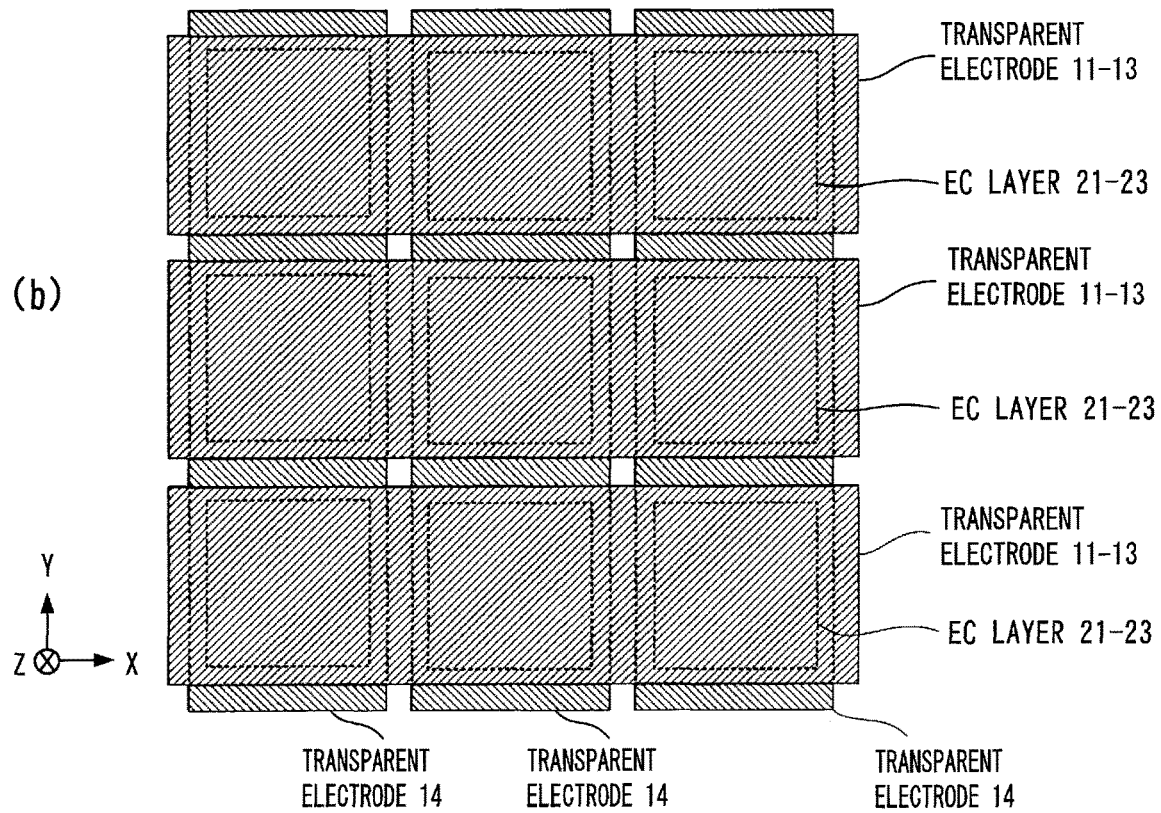

In reference to FIG. 2 and FIG. 3, the structure of the image sensor 3 in the first embodiment will be explained. FIG. 2 is a block diagram showing the structure of part of the image sensor 3 in the first embodiment in an abridged presentation. FIG. 3 presents diagrams illustrating the image sensor 3 in the first embodiment. FIG. 3(a) presents an example of a structure that may be adopted in the image sensor 3 in a sectional view, whereas FIG. 3(*b*) illustrates how transparent electrodes may be laid out in the filter units at the image sensor 3 in a plan view. As shown in FIG. 2, the image sensor 3 includes a plurality of pixels 10, a filter vertical drive unit 40, a filter horizontal drive unit 50, a filter control unit 60, a pixel vertical drive unit 70, a column circuit unit 80, a horizontal scanning unit 90, an output unit 100 and a system control unit 110. At the image sensor 3, the pixels 10 are disposed in a two-dimensional pattern (e.g., along a row direction, i.e., along a first direction, and a column direction, i.e., a second direction intersecting the first direction). While only 16 pixels (across)×12 pixels (down) are shown as the pixels 10 so as to simplify the illustration in the example presented in FIG. 2, the image sensor 3 actually includes, for instance, several million to several hundred million pixels, or an even greater number of pixels.

The image sensor 3 may be, for instance, a back-illuminated image sensor. As shown in FIG. 3(*a*), the image sensor 3 includes a semiconductor substrate 220, a wiring layer 210 laminated on the semiconductor substrate 220, a support substrate 200, microlenses 31 and filter units 5. The semiconductor substrate 220 is constituted with, for instance, a silicon semiconductor substrate, whereas the support substrate 200 is constituted with a semiconductor substrate, a glass substrate or the like. The semiconductor substrate 220 is laminated on the support substrate 200 via the wiring layer 210. In the wiring layer 210, which includes a conductor film (metal film) and an insulating film, a plurality of wirings, vias and the like are disposed. The conductor film may be constituted of, for instance, copper or aluminum. The insulating film may be an oxide film, a nitride film or the like. As shown in FIG. 3(*a*), incident light enters the image sensor primarily toward the + side of a Z axis. As the coordinate axes in the figure indicate, the direction running rightward on the drawing sheet perpendicular to the Z axis is designated as an X axis+direction and the direction running away from the viewer of the drawing, perpendicular to the Z axis and the X axis, is designated as a Y axis+direction.

The semiconductor substrate 220 has a first surface 201*a* used as an entry surface at which light enters and a second surface 201*b* different from the first surface 201*a*. The second surface 201*b* is located on the side opposite from the first surface 201*a*. The wiring layer 210 is laminated on the side at which the second surface 201*b* of the semiconductor substrate 220 is located. Since light is radiated from the side opposite the wiring layer 210, i.e., the side on which the first surface 201*a* is located, the image sensor 3 functions as a back-illuminated image sensor. The semiconductor substrate 220 includes photoelectric conversion units 34 disposed in the area between the first surface 201*a* and the second surface 201*b*. At a photoelectric conversion unit 34, which may be constituted with, for instance, a photodiode (PD), light having entered therein is converted to an electric charge. A signal generated based upon the electric charge resulting from the photoelectric conversion at the photoelectric conversion unit 34 is output to the wiring layer 210. A plurality of pixels 10, each having a photoelectric conversion unit 34, are disposed along the X axis and along the Y axis. On the side where the first surface 201*a* of the semiconductor substrate 220 is located, a filter unit 5 and a microlens 31 are disposed in correspondence to each pixel 10.

A pixel 10 is structured so as to include a microlens 31, a filter unit 5, light shielding films 32 and a photoelectric conversion unit 34. The microlens 31 condenses light having entered therein onto the photoelectric conversion unit 34. The light shielding films 32, each disposed at a boundary between pixels 10 disposed adjacent to each other, minimize light leakage from one pixel to another.

The filter unit 5 includes electro-chromic (hereafter will be referred to as EC) layers 21, 22 and 23 and transparent electrodes 11, 12, 13 and 14, laminated in sequence, starting on the side where the microlens 31 is present, toward the semiconductor substrate 220. The EC layers 21 through 23 are formed by using an electro-chromic material such as a metal oxide. The transparent electrodes 11 through 14 may be constituted of, for instance, ITO (indium tin oxide). An insulating film 33 is disposed in the areas between the EC layer 21 and the transparent electrode 12, between the EC layer 22 and the transparent electrode 13, and between the EC layer 23 and the transparent electrode 14. In addition, an electrolytic layer (electrolytic film) (not shown) is disposed in the filter unit 5.

Transparent electrodes 11 are disposed, each in correspondence to a plurality of EC layers 21 that are disposed one after another along the X direction, i.e., the row direction, so as to cover one side of the surfaces of the plurality of EC layers 21, as is clearly shown in FIG. 3(*b*). In the example presented in FIG. 2, the pixels 10 are arrayed over twelve rows and thus, twelve transparent electrodes 11 are disposed parallel to one another. Transparent electrodes 12 and transparent electrodes 13 are also disposed in much the same way as the transparent electrodes 11, so as to cover one side of the surfaces of the plurality of EC layers 22, disposed one after another along the X direction, or one side of the surfaces of the plurality of EC layers 23 disposed one after another along the X direction.

A transparent electrode 14, which is a common electrode used in conjunction with three EC layers 21, 22 and 23, is disposed on the side where the other surface of the EC layer 23 is located. Common transparent electrodes 14 are disposed, each in correspondence to the plurality of EC layers 23 that are disposed one after another along the Y direction, i.e., the column direction, along the plurality of EC layers 23 disposed one after another along the column direction, as is clearly shown in FIG. 3(*b*). In the example presented in FIG. 2, the pixels 10 are arrayed over 16 columns, and thus, 16 common transparent electrodes 14 are disposed parallel to one another.

The transparent electrodes 11 through 13 and the common transparent electrodes 14 are electrodes disposed in a matrix pattern (mesh pattern) in relation to the EC layers 21, 22 and 23. The transparent electrodes 11 through 13 are connected to the filter vertical drive unit 40, whereas the common transparent electrodes 14 are connected to the filter horizontal drive unit 50. Thus, active matrix drive that enables drive control for the EC layers 21, 22 and 23 can be executed by using the electrodes disposed in the matrix pattern in the embodiment.

An EC layer 21 produces Mg (magenta) color through an oxidation-reduction reaction induced as a drive signal is provided via the corresponding transparent electrode 11 and common transparent electrode 14. This means that light in a wavelength range corresponding to Mg (magenta) in the incident light is transmitted through the EC layer 21 as a drive signal is provided thereto. An EC layer 22 produces Ye (yellow) color through an oxidation-reduction reaction induced as a drive signal is provided via the corresponding transparent electrode 12 and common transparent electrode 14. This means that light in a wavelength range corresponding to Ye (yellow) in the incident light is transmitted through the EC layer 22 as a drive signal is provided thereto. An EC layer 23 produces Cy (cyan) color through an oxidation-reduction reaction induced as a drive signal is provided via the corresponding transparent electrode 13 and common transparent electrode 14. This means that light in a wavelength range corresponding to Cy (cyan) in the incident light is transmitted through the EC layer 23 as a drive signal is provided thereto. At each EC layer among the EC layers 21, 22 and 23, the color produced as described above is sustained over a predetermined length of time even when the drive signal is no longer provided thereto, whereas the EC layers achieve a transparent (achromatic) state, in which light in the entire wavelength range in the light having entered the filter unit 5 is transmitted through them when a reset signal is provided thereto.

As described above, the plurality of filter units 5 are each configured with three filters, i.e., an EC layer 21 that produces Mg (magenta) color, an EC layer 22 that produces Ye (yellow) color and an EC layer 23 that produces Cy (cyan) color. This means that light primarily in a specific wavelength range among the wavelength ranges corresponding to Mg, Ye, Cy, W (white), BK (black), R (red), G (green) and B (blue) can be allowed to be transmitted through a filter unit 5 by selecting a specific combination of transmission wavelengths for the EC layers 21 through 23.

The filter control unit 60 in FIG. 2 sets (adjusts) the transmission wavelength for each filter unit 5 by controlling signals input to the filter unit 5 from the filter vertical drive unit 40 and the filter horizontal drive unit 50. The filter vertical drive unit 40 selects a specific row among a plurality of rows over which filter units 5 are disposed one after another i.e., it selects a specific transparent electrode among the plurality of transparent electrodes 11 through 13, and provides a drive signal to the selected transparent electrode. The filter horizontal drive unit 50 selects a specific column among a plurality of columns in which filter units 5 are disposed side by side, i.e., it selects a specific common transparent electrode among the plurality of common transparent electrodes 14, and provides a drive signal to the selected common transparent electrode. As a result, an EC layer corresponding to both the transparent electrode among the transparent electrodes 11 through 13 selected by the filter vertical drive unit 40 and the common transparent electrode 14 selected by the filter horizontal drive unit 50 produces a color.

For instance, the filter horizontal drive unit 50 may select the common transparent electrode 14 located at the right end, among the three common transparent electrodes 14 in FIG. 3(b), and provide a drive signal to the selected common transparent electrode 14, and the filter vertical drive unit 40 may select the transparent electrode 11 located at the upper end among the nine transparent electrodes 11 through 13 and provide a drive signal thereto. In such a case, the EC layer 21 located at the upper right end position will produce a color. In addition, if the filter horizontal drive unit 50 selects the same common transparent electrode 14 and provides a drive signal thereto and the filter vertical drive unit 40 selects the transparent electrode 12 located at the upper end and provides a drive signal thereto, the EC layer 22 at the upper right end will produce a color. If the filter horizontal drive unit 50 selects the same common transparent electrode 14 and provides a drive signal thereto and the filter vertical drive unit 40 selects the transparent electrode 13 located at the upper end and provides a drive signal thereto, the EC layer 23 at the upper right end will produce a color.

The pixel vertical drive unit 70 provides control signals such as a signal TX, a signal RST and a signal SEL which will be described in detail later, to the various pixels 10, so as to control operations of the individual pixels 10. The system control unit 110 controls the filter control unit 60, the pixel vertical drive unit 70, the column circuit unit 80, the horizontal scanning unit 90 and the output unit 100 based upon control signals used to control operations of the image sensor 3, which are output from the control unit 4 in the electronic camera 1. The system control unit 110, which includes, for instance, a pulse generation circuit and the like, controls the components listed above by outputting pulse signals and the like, generated based upon the control signals provided by the control unit 4, to the filter control unit 60 and the like.

The column circuit unit 80, configured so as to include a plurality of analog/digital conversion units (A/D conversion units), converts signals, which are output from the individual pixels 10, to digital signals and outputs the digital signals resulting from the conversion to the horizontal scanning unit 90. The horizontal scanning unit 90 sequentially outputs the signals, having been output from the column circuit unit 80, to the output unit 100 based upon pulse signals or the like output from the system control unit 110. The output unit 100, which includes a signal processing unit (not shown), executes signal processing such as correlated double sampling and signal level correction processing and outputs the signals having undergone the signal processing to the control unit 4 in the electronic camera 1. The output unit 100, having an input/output circuit and the like supporting a high-speed interface such as LVDS and SLVS, is able to transmit the signals to the control unit 4 at high speed.

Figure 4:
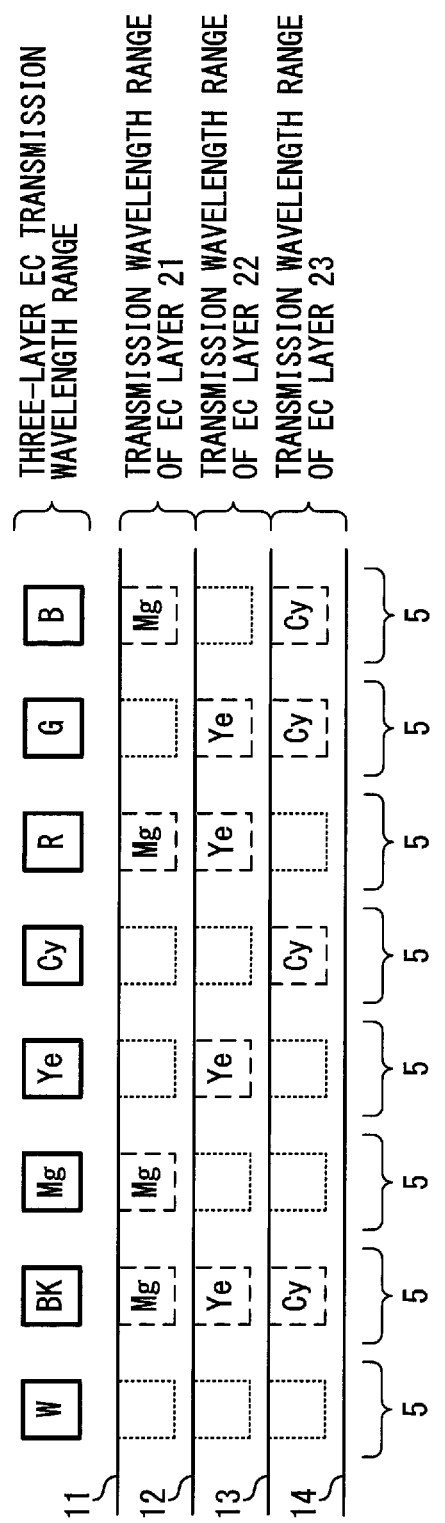

FIG. 4 shows how transmission wavelengths may be selected at the filter units in the first embodiment. In the example presented in FIG. 4, the filter unit 5 is set in a state in which light in a wavelength range for W (white), BK (black), Mg (magenta), Ye (yellow), Cy (cyan), R (red), G (green) or B (blue) is primarily transmitted by selecting a specific combination of transmission wavelengths for the EC layers 21 through 23.

In FIG. 4, Mg inside a dash-line frame indicates a state in which light in the Mg wavelength range is transmitted through the EC layer 21. Ye inside a dash-line frame indicates a state in which light in the Ye wavelength range is transmitted through the EC layer 22. Cy inside a dash-line frame indicates a state in which light in the Cy wavelength range is transmitted through the EC layer 23. In addition, a dotted-line frame indicates that the corresponding EC layer is in a transparent (achromatic) state in which light in the entire wavelength range is transmitted through the EC layer. W, BK, Mg, Ye, Cy, R, G or B inside a solid-line frame indicates the wavelength range of light transmitted through the three EC layers 21, 22 and 23 (three-layer EC transmission wavelength range).

When a drive signal is provided to an EC layer 21, the EC layer 21 enters a state in which it absorbs light in the G wavelength range and allows light in the R wavelength range and light in the B wavelength range to be transmitted, i.e., a state in which light in the Mg wavelength range is transmitted. In addition, when a drive signal is provided to an EC layer 22, the EC layer 22 enters a state in which it absorbs light in the B wavelength range and allows light in the R wavelength range and light in the G wavelength range to be transmitted, i.e., a state in which light in the Ye wavelength range is transmitted. Moreover, when a drive signal is provided to an EC layer 23, the EC layer 23 enters a state in which it absorbs light in the R wavelength range and allows light in the G wavelength range and light in the B wavelength range to be transmitted, i.e., a state in which light in the Cy wavelength range is transmitted.

When a drive signal is provided to the EC layer 21 alone, the EC layer 22 alone or the EC layer 23 alone among the three EC layers 21, 22 and 23, the three-layer EC transmission wavelength range for Mg (magenta), Ye (yellow) or Cy (cyan) is set. In addition, when drive signals are provided to both the EC layer 21 and the EC layer 22, the three-layer EC transmission wavelength range for R (red) is set, when drive signals are provided to both the EC layer 22 and the EC layer 23, the three-layer EC transmission wavelength range for G (green) is set, and when drive signals are provided to both the EC layer 21 and the EC layer 23, the three-layer EC transmission wavelength range for B (blue) is set. When no drive signal is provided to any of the EC layers 21, 22 and 23, light in the full wavelength range is transmitted through all the EC layers 21 through 23 and thus, the three-layer EC transmission wavelength range for W (white) is set. When drive signals are provided to all three EC layers 21, 22 and 23, light in the G wavelength range is absorbed in the EC layer 21, light in the B wavelength range is absorbed in the EC layer 22 and light in the R wavelength range is absorbed in the EC layer 23, thereby setting the three-layer EC transmission wavelength range for BK (black).

Figure 5:
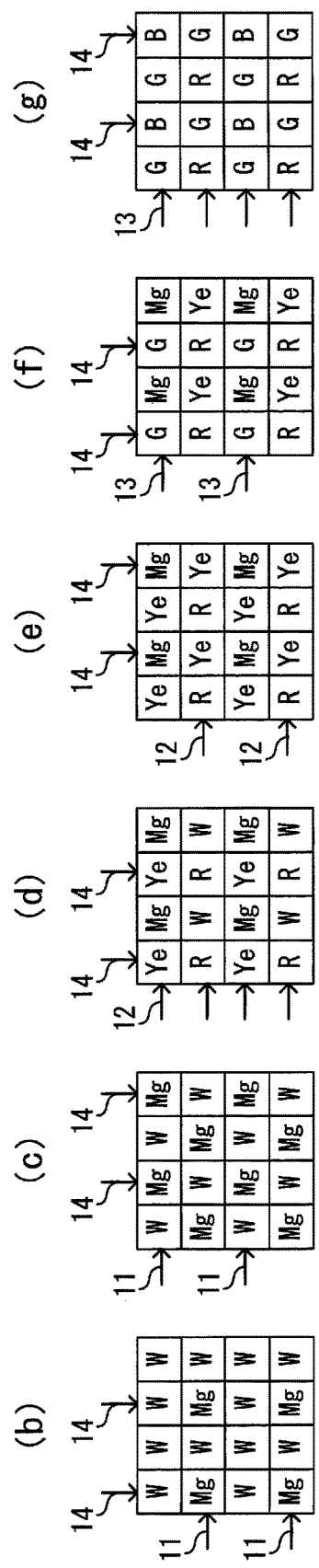

FIG. 5 illustrates how the transmission wavelengths may be altered at the filter units 5 in the first embodiment. It is to be noted that for purposes of simplification, filter units 5 in only four pixels (across)×four pixels (down) taking positions at a coordinate point (1, 1) through a coordinate point (4, 4) are shown in FIG. 5. FIGS. 5(a) through 5(g) illustrate in time sequence how the four×four pixels, initially all set in a W (white) state, shift into a state in which they form an RGB Bayer array pattern, as a voltage is sequentially applied to specific transparent electrodes among the transparent electrodes 11 through 14 in the individual filter units 5.

In the initial state shown in FIG. 5(a), all the filter units 5 are in a state in which the entering light is transmitted over its full wavelength range, i.e., all the filter units 5 function as W filter units 5. The filter control unit 60 may supply a positive potential to the transparent electrodes 11 through 13 in all the filter units 5 and supply a negative potential to the common transparent electrodes 14 in all the filter units 5 so as to cause the EC layers 21 through 23 in a transparent (achromatic) state, in which light entering the filter units 5 is transmitted in its full wavelength range.

The filter control unit 60 executes control to achieve the condition illustrated in FIG. 5(b) by applying voltages, which are the opposite of those applied to cause the EC layers achromatic, to the common electrodes 14 at the filter units 5 in the first column and the third column and to the transparent electrodes 11 at the filter units 5 in the first row and the third row, i.e., it applies a positive potential to the common transparent electrodes 14 and a negative potential to the transparent electrodes 11. As a result, the filter units 5 at the coordinate points (1, 1), (1, 3), (3, 1) and (3, 3) enter a state in which magenta color is produced at the EC layers 21 and thus, the filter units 5 at these four coordinate point positions function as Mg filter units 5, through which light primarily in the magenta wavelength range is transmitted. In addition, while the voltage application to the filter units 5 at the coordinate points (1, 1), (1, 3), (3, 1) and (3, 3) stops after the voltage is applied over a predetermined length of time, the color will be sustained over a specific length of time due to the "memory effect" at the EC layers.

The filter control unit 60 executes control to achieve the condition illustrated in FIG. 5(c) by applying a positive potential to the common transparent electrodes 14 at the filter units 5 in the second column and the fourth column and applying a negative potential to the transparent electrodes 11 at the filter units 5 in the second row and the fourth row. As a result, the filter units 5 at the coordinate points (2, 2), (2, 4), (4, 2) and (4, 4) enter a state in which magenta color is produced at the EC layers 21 and thus, the filter units 5 at these coordinate point positions function as Mg filter units 5.

The filter control unit 60 executes control to achieve the condition illustrated in FIG. 5(d) by applying a positive potential to the common transparent electrodes 14 at the filter units 5 in the first column and the third column and applying a negative potential to the transparent electrodes 12 at the filter units 5 in the first row through the fourth row. As a result, the filter units 5 at the coordinate points (2, 1), (2, 3), (4, 1) and (4, 3) enter a state in which yellow color is produced at the EC layers 22 and thus, the filter units 5 at these coordinate point positions function as Ye filter units 5, through which light primarily in the yellow wavelength range is transmitted. In addition, the filter units 5 at the coordinate points (1, 1), (1, 3), (3, 1) and (3, 3), where the EC layers 21 enter a state of magenta color production and the EC layers 22 enter a state of yellow color production, are caused to function as R filter units 5 through which light primarily in the red wavelength range is transmitted.

The filter control unit 60 executes control to achieve the condition illustrated in FIG. 5(e) by applying a voltage to the common transparent electrodes 14 at the filter units in the second column and the fourth column and applying a voltage to the transparent electrodes 12 at the filter units 5 in the first row and the third row. As a result, the filter units 5 at the coordinate points (1, 2), (1, 4), (3, 2) and (3, 4) enter a state in which yellow color is produced at the EC layers 22 and thus, the filter units 5 at these coordinate point positions function as Ye filter units 5.

The filter control unit 60 executes control to achieve the condition illustrated in FIG. 5(f) by applying a voltage to the common transparent electrodes 14 at the filter units 5 in the first column and the third column and applying a voltage to the transparent electrodes 13 at the filter units 5 in the second row and the fourth row. As a result, the filter units 5 at the coordinate points (2, 1), (2, 3), (4, 1) and (4, 3) enter a state in which yellow color is produced at the EC layers 22 and cyan color is produced at the EC layers 23, thereby causing the filter units 5 to function as G filter units 5 through which light primarily in the green wavelength range is transmitted.

The filter control unit 60 executes control to achieve the condition illustrated in FIG. 5(g) by applying a voltage to the common transparent electrodes 14 at the filter units in the second column and the fourth column and applying a voltage to the transparent electrodes 13 at the filter units 5 in the first row through the fourth row. As a result, the filter units 5 at the coordinate points (1, 2), (1, 4), (3, 2) and (3, 4) enter a state in which yellow color is produced at the EC layers 23 and cyan color is produced, thereby causing the filter units 5 to function as a G filter units 5. In addition, the filter units 5 at the coordinate points (2, 2), (2, 4), (4, 2) and (4, 4), where the EC layers 21 enter a state of magenta color production and the EC layers 23 enter a state of cyan color production, are caused to function as B filter units 5 through which light primarily in the blue wavelength range is transmitted.

The filter control unit 60 is capable of controlling the filter units 5 in the pixels 10 so as to form a Bayer array pattern with R pixels having R filter units 5, G pixels having G filter units 5 and B pixels having B filter units 5 as illustrated in FIG. 5(g). As described above, the filter control unit 60 in the embodiment is able to alter the transmission wavelength at each filter unit 5 through sequential control of the transmission wavelength at the individual filter units 5. In addition, the filter control unit 60 is able to simultaneously control the transmission wavelengths at the plurality of filter units 5 disposed along the row direction or the column direction by providing electric signals via the transparent electrodes 11 through 14 disposed in a matrix pattern and then and stopping the electric signals.

The image sensor 3 in the embodiment is capable of executing processing through which signals are individually read out from all the pixels 10 and processing through which signals, each representing the sum of signals generated at a plurality of pixels 10, are read out, as will be explained in detail below. The image sensor 3 may execute the processing through which the signals generated at all the pixels 10 in the image sensor 3 are individually read out when photographing a still image, whereas it may execute the processing for reading out signals each representing the sum of signals generated at a plurality of pixels 10 when shooting movie. In addition, while the image sensor 3 may include an extremely large number of pixels (e.g., several hundred million pixels), it is rare that a display device capable of displaying a high-resolution image expressed with the extremely large number of pixels in the image sensor is used. Accordingly, addition processing for adding together signals generated at a plurality of pixels 10 will be executed so as to generate signals in a quantity corresponding to the number of pixels required to express an image brought up on display at the display device in use. The "addition processing" executed under such circumstances includes averaging processing through which a plurality of signals are added together and averaged, weighted addition processing through which a plurality of signals are first weighted and added together, and the like. It is to be noted that the method that may be adopted when generating a signal by using signals generated at a plurality of pixels is not limited to these examples.

Figure 6:
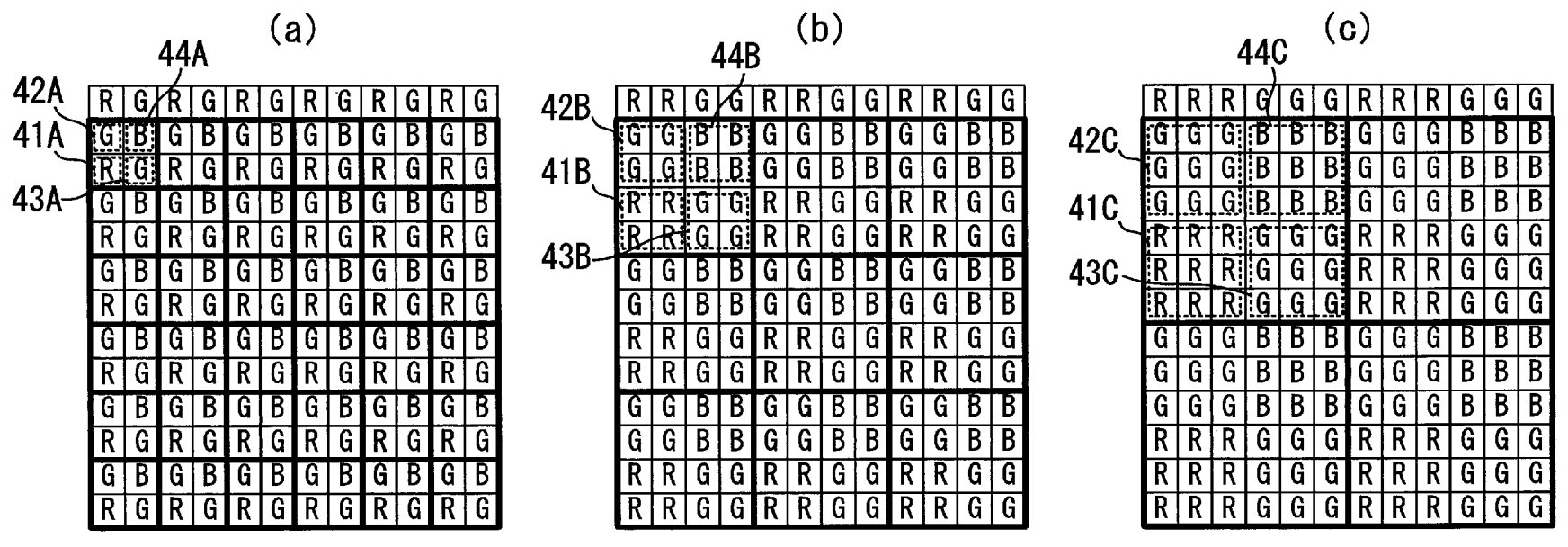

FIG. 6 presents examples of control that may be executed on the filter units 5 in the first embodiment. As explained earlier, the filter control unit 60 is able to create R pixels having R filter units 5, G pixels having G filter units 5 and B pixels having B filter units 5 by setting specific transmission wavelengths for the individual filter units 5. In the example presented in FIG. 6(a), a region 41A corresponding to a single R pixel, a region 42A and a region 43A each corresponding to a single G pixel and a region 44A corresponding to a single B pixel together constitute a Bayer array basic unit (41A, 42A, 43A and 44A). At the image sensor 3, the disposition of the 2 pixels×2 pixels basic unit (41A, 42A, 43A and 44A) is reiterated.

In the example presented in FIG. 6(b), a region 41B that contains 2×2=4 R pixels, a region 42B and a region 43B each of which contains 2×2=4 G pixels, and a region 44B that contains 2×2=4 B pixels are set in a Bayer array pattern. In the example presented in FIG. 6(b), the 4×4 pixels present in the regions 41B through 44B form a Bayer array reiterating basic unit. In the example in FIG. 6(c) a region 41C that contains 3×3=9 R pixels, a region 42C and a region 43C each of which contains 3×3=9 G pixels, and a region 44C that contains 3×3=9 B pixels are set in a Bayer array pattern. In the example in FIG. 6(c), the 6×6 pixels present in the regions 41C through 44C together form a Bayer array reiterating basic unit. Namely, the filter control unit 60 in the embodiment is able to adjust the size of the Bayer array basic unit by controlling the filter units 5 so as to set the same transmission wavelength range for the filter units 5 in a plurality of pixels disposed adjacent to each other. In other words, the size of the Bayer array basic unit can be adjusted to that made up with the regions 41A through 44A, where 2×2 pixels are present, to that made up with regions 41B through 44B, where 4×4 pixels are present or to that made up with the regions 44C through 44C where 6×6 pixels are present.

When the regions 41B, 42B, 43B and 44B constituting the basic unit are each made up with 2×2=4 pixels, as shown in FIG. 6(b), a sum pixel signal is generated through addition processing executed by adding together the pixel signals from the four pixels in each region. More specifically, the image sensor 3 generates sum pixel signals each by adding together the pixel signals generated at the 2×2=4 pixels in one of the plurality of regions 41B through 44B, as will be explained later. As a result, when sum pixel signals are output by controlling the transmission wavelength ranges at the filter units 5, as shown in FIG. 6(b), the resolution is lowered to ¼ that of an image expressed with signals individually output from the individual pixels, as shown in FIG. 6(a). Likewise, when the regions 41C, 42C, 43C and 44C constituting the basic unit are each made up with 3×3=9 pixels, as shown in FIG. 6(c), a sum pixel signal is generated through addition processing executed by adding together the pixel signals from the nine pixels in each region. As a result, when sum pixel signals are output by controlling the transmission wavelength ranges at the filter units 5, as shown in FIG. 6(c), the resolution is lowered to ⅑ that of an image expressed with signals individually output from the individual pixels, as shown in FIG. 6(a).

It is to be noted that instead of adding together the pixel signals generated at the four pixels in each of the regions 41B through 44B or adding together the pixel signals generated at the nine pixels in each of the regions 41C through 44C through addition processing executed within the image sensor 3, as will be explained later in reference to FIG. 8, pixel signals originating from the image sensor 3 may undergo addition processing in the control unit 4 shown in FIG. 1.

It is desirable that the electronic camera 1 capture an image at high resolution when the number of display pixels at the display device at which image data generated in the image sensor 3 are brought up on display is substantially equal to the number of pixels at the image sensor 3 and that it capture an image at a relatively low resolution if the number of display pixels is smaller than the number of pixels at the image sensor 3. Likewise, it is desirable that the electronic camera 1 capture an image at high resolution when an image expressed with the image data is to be printed out in a large format and that it capture an image at low resolution if the image expressed with the image data is to be printed out in a small size.

Accordingly, if the electronic camera 1 in the embodiment is set in a high-resolution photographing mode via, for instance, an operation unit (not shown), the filter control unit 60 controls the filter units 5 in the individual pixels 10, as shown in FIG. 6(a). Likewise, if the electronic camera 1 is set in a lower-resolution photographing mode via, for instance, the operation unit (not shown), the filter control unit 60 controls the filter units 5 in the individual pixels 10, as shown in FIG. 6(b) or 6(c).

In addition, if the electronic camera 1 is set in a still image photographing mode via the operation unit (not shown), the filter control unit 60 controls the filter units 5 at the individual pixels 10, as shown in FIG. 6(a) so as to obtain high-resolution image data. If, on the other hand, the electronic camera 1 is set in a movie shooting mode via the operation unit (not shown), the filter control unit 60 controls the filter units 5 in the individual pixels 10, as shown in FIG. 6(b) or FIG. 6(c) so as to achieve a high frame rate.

An image sensor, having filter units with fixed transmission wavelengths disposed in a Bayer array, needs to add together signals generated at a plurality of same-color pixels corresponding to a given color, which are disposed at positions set apart from one another. In this situation, the signal generated at a pixel corresponding to a different color present between the same-color pixels will not be used and thus will be wasted. Furthermore, color mixing may occur in the same-color pixel signals to be added together, due to crosstalk from different-color pixels adjacent to the same-color pixels.

The regions 41A through 44A, the regions 41B through 44B or the regions 41C through 44C, constituting the Bayer array basic unit in the embodiment, are each invariably made up with same-color pixels. This means that the signals generated at the same-color pixels within each region 41 through 44 can be added together. Since the filter units 5 in adjacent pixels correspond to the same color, crosstalk from a pixel having a different-color filter unit can be limited.

Figure 7:
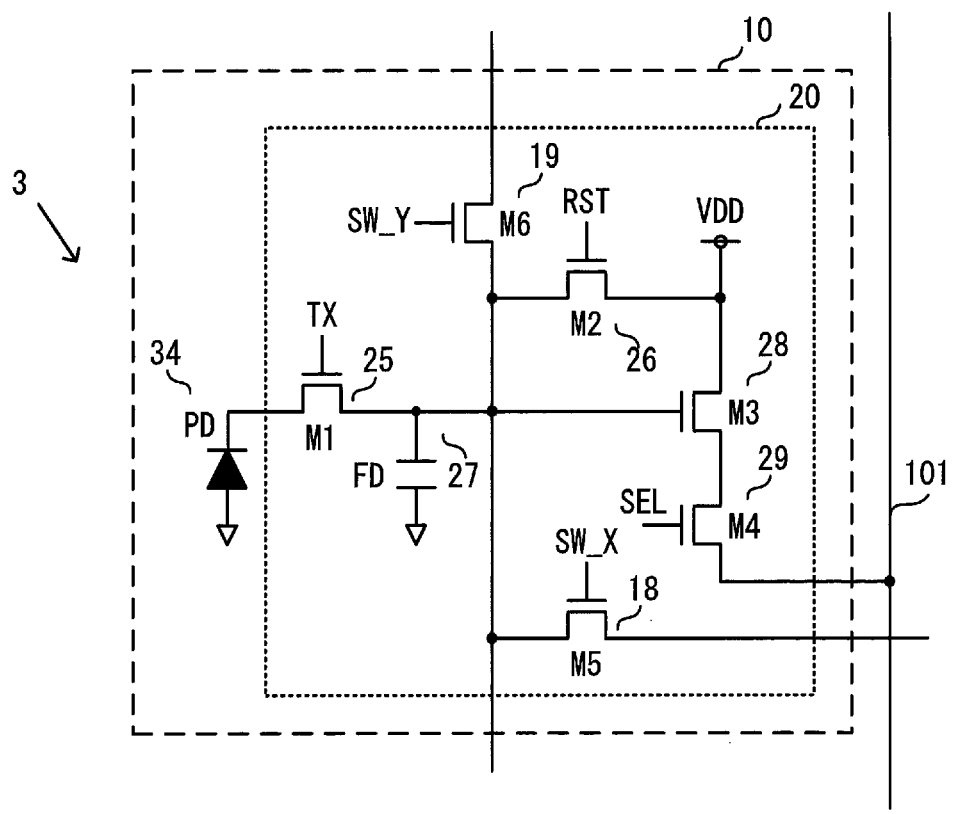

In reference to FIG. 7 and FIG. 8, the circuit structure adopted in the image sensor 3 in the first embodiment will be explained. FIG. 7 is a circuit diagram showing the structure adopted in a pixel 10 in the first embodiment. FIG. 8 is a circuit diagram showing the structure in part of the image sensor 3 in the first embodiment. The pixels 10 each include a photoelectric conversion unit 34 and a readout unit 20. The photoelectric conversion unit 34 has a function of converting light having entered therein to an electric charge and accumulating the electric charge resulting from the photoelectric conversion. The readout unit 20 includes a transfer unit 25, a reset unit 26, a floating diffusion 27, an amplifier unit 28, a selection unit 29, a first switch unit 18 and a second switch unit 19.

The transfer unit 25 transfers the electric charge resulting from the photoelectric conversion executed at the photoelectric conversion unit 34 to the floating diffusion 27 under control executed based upon a signal TX. Namely, the transfer unit 25 forms an electric charge transfer path between the photoelectric conversion unit 34 and the floating diffusion 27. The electric charge is accumulated (held) in a capacitance FD at the floating diffusion 27. The amplifier unit 28 amplifies a signal generated based upon the electric charge held in the capacitance FD and outputs the amplified signal. In the example presented in FIG. 7, the amplifier unit 28 is configured with a transistor M3, a drain terminal, a gate terminal and a source terminal of which are respectively connected to a source VDD, the floating diffusion 27 and the selection unit 29. The source terminal of the amplifier unit 28 is connected to a vertical signal line 101 via the selection unit 29. The amplifier unit 28 functions as part of a source follower circuit that uses a current source 81 shown in FIG. 8 as a load current source.

The reset unit 26, which is controlled based upon a signal RST, resets the electric charge at the capacitance FD and resets the potential at the floating diffusion 27 to a reset potential (reference potential). The selection unit 29, which is controlled based upon a signal SEL, outputs the signal provided from the amplifier unit 28 to the vertical signal line 101. The transfer unit 25, the reset unit 26 and the selection unit 29 may be respectively configured with, for instance, a transistor M1, a transistor M2 and a transistor M4.

Figure 8:
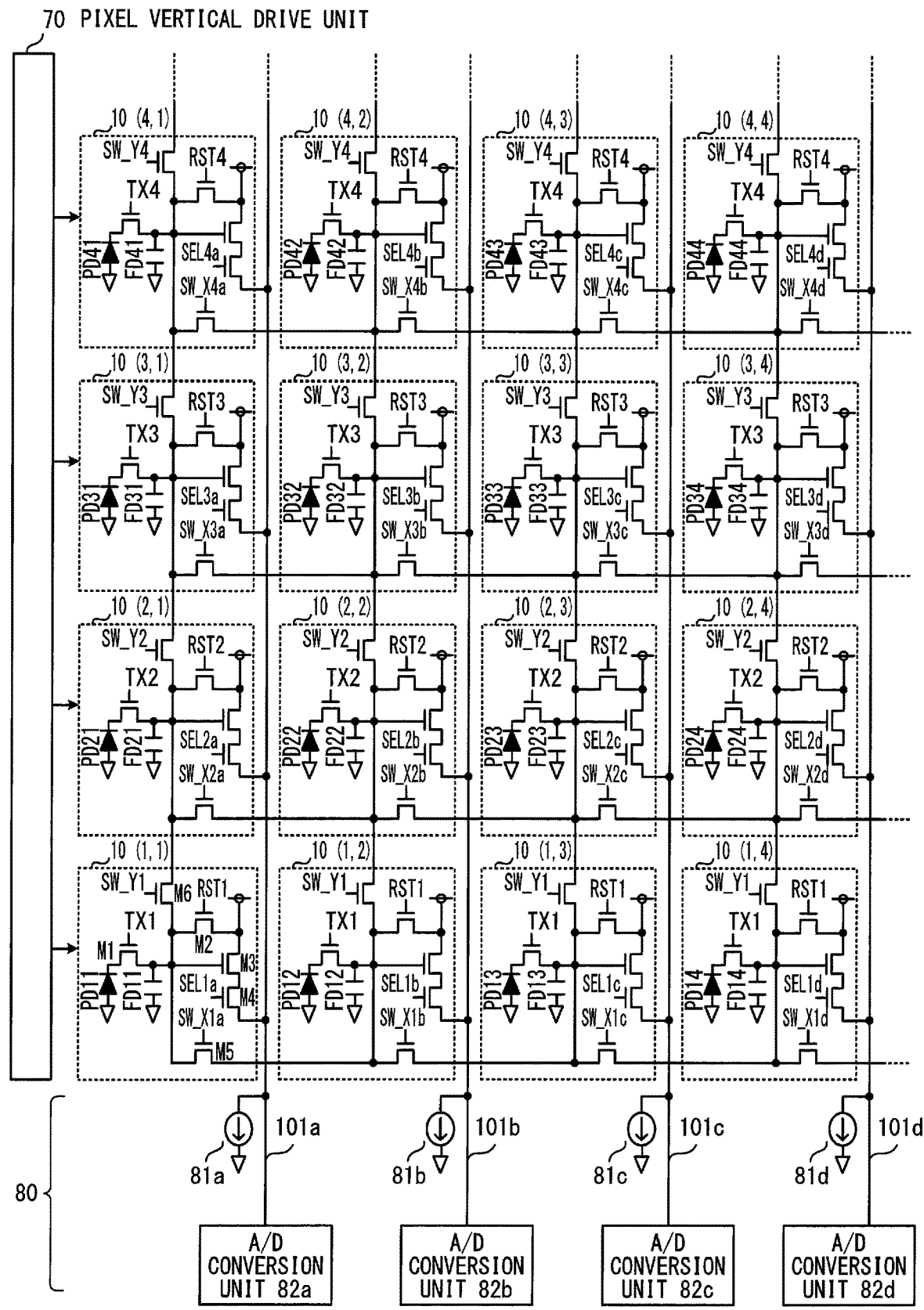

Via first switch units 18, each controlled with a signal SW_X, the floating diffusions 27 in a plurality of pixels 10 disposed side-by-side along the row direction (the first direction) are connected as shown in FIG. 8. Via second switch units 19, each controlled with a signal SW_Y, the floating diffusions 27 in a plurality of pixels 10 disposed side-by-side along the column direction (the second direction) are connected as shown in FIG. 8. A first switch unit 18 and a second switch unit 19 may be constituted with, for instance, a transistor M5 and a transistor M6 respectively.

The readout unit 20 reads out a signal (pixel signal) corresponding to an electric charge transferred by the transfer unit 25 from the photoelectric conversion unit 34 to the floating diffusion 27 and a signal (noise signal) generated when the potential at the floating diffusion 27 is reset to the reset potential, to the vertical signal line 101.

As shown in FIG. 8, the image sensor 3 includes a plurality of pixels 10 disposed in a matrix pattern, the pixel vertical drive unit 70 and the column circuit unit 80. The column circuit unit 80 includes current sources 81 (current source 81a through current source 81d) and A/D conversion units 82 (A/D conversion unit 82a through A/D conversion unit 82d). The current sources 81 and the A/D conversion units 82 are each disposed in correspondence to one of the pixel columns each made up with a plurality of pixels disposed side-by-side along the column direction, i.e., along the longitudinal direction. In addition, vertical signal lines 101 (vertical signal line 101a through vertical signal line 101d) are disposed each in correspondence to one of the columns made up with pixels 10. It is to be noted that only a small number of pixels 10, i.e., four pixels (across)×four pixels (down), are shown in FIG. 8 so as to simplify the illustration. Among the plurality of pixels 10 shown in FIG. 8, the pixel 10 taking the lower left position is designated as a first row/first column pixel 10 (1, 1), and FIG. 8 shows the pixel 10 (1, 1) through the pixel 10 (4, 4).

The pixel vertical drive unit 70 provides a signal TX, a signal RST, a signal SEL, a signal SW_X and a signal SW_Y to each pixel 10. A current source 81, which is connected via the corresponding vertical signal line 101 with the individual pixels 10, generates a current to be used for reading out the pixel signal and the noise signal from each pixel 10. The current source 81 supplies the electric current that it has generated to the corresponding vertical signal line 101 and pixels 10. An A/D conversion unit 82 converts signals output to the corresponding vertical signal line 101 to digital signals.

In the embodiment, the pixel vertical drive unit 70, the first switch units 18, the second switch units 19, and the capacitances FD together function as an adder unit that adds together signals provided from the photoelectric conversion units 34. In more specific terms, the pixel vertical drive unit 70 outputs signals SW_X and signals SW_Y to the individual pixels 10 and executes ON/OFF control for the first switch units 18 and the second switch units 19 therein so as to execute addition processing for adding together signals originating in the plurality of photoelectric conversion units 34.

Figure 9:
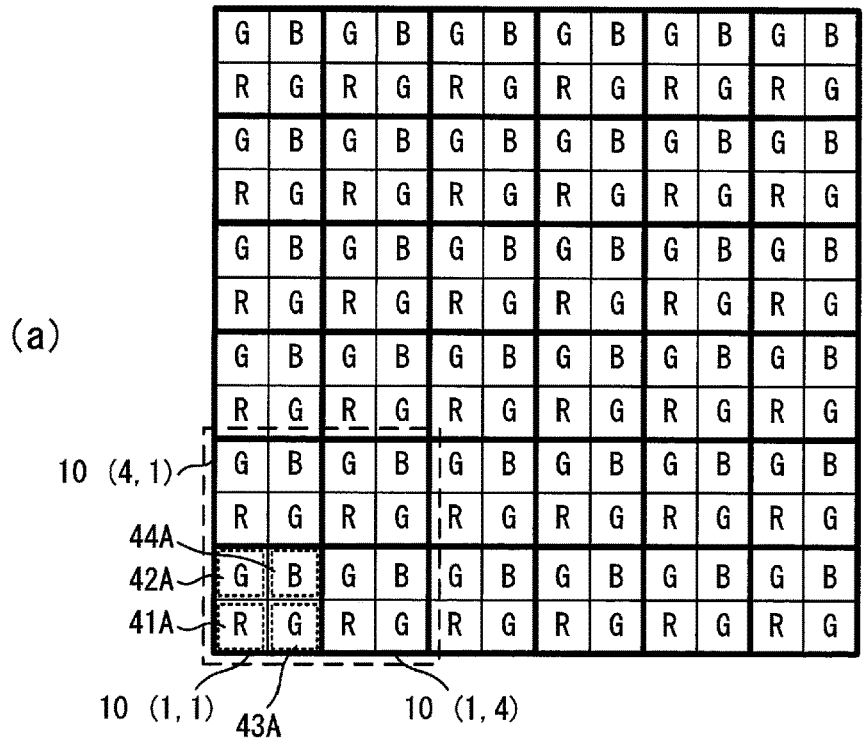
Figure 9:
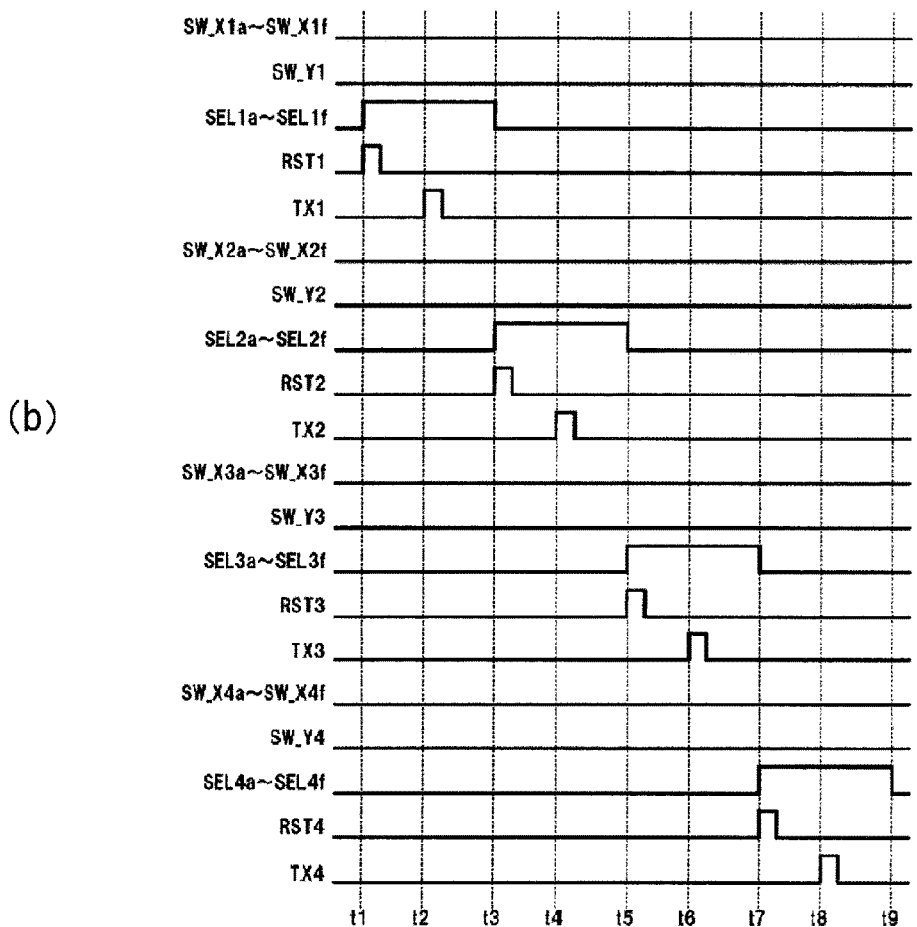

FIG. 9 illustrates how an operation may be executed in the image sensor 3 in the first embodiment. FIG. 9(a) shows a Bayer array reiterating basic unit made up with 2×2 pixels present in regions 41A through 44A. FIG. 9(b) is a timing chart of an operation that may be executed in the image sensor 3 when the transmission wavelengths at the filter units 5 are set as shown in FIG. 9(a). In FIG. 9(b), time points are indicated along the horizontal axis. In the timing chart in FIG. 9(b), a transistor to which a high-level control signal (e.g., at the source potential) is input, enters an ON state and a transistor to which a low-level control signal (e.g., at the ground potential) is input, enters an OFF state.

At a time point t1, a signal RST1 shifts to high level, thereby setting the transistors M2 constituting the reset units 26 in an ON state and setting the potentials at the floating diffusions 27 to the reset potential at the pixels 10 (1, 1) through 10 (1, 4) in the first row. In addition, at the time point t1, signals SEL1a through SEL1f shift to high level and, as a result, noise signals originating at the pixel 10 (1, 1) through the pixel 10 (1, 4) are respectively output to a vertical signal line 101a through a vertical signal line 101d via the transistors M3 constituting the amplifier units 28 and the transistors M4 constituting the selection units 29. The noise signals from the pixels 10 in the first row, individually output to the vertical signal line 101a through the vertical signal line 101d, are respectively input to the A/D conversion unit 82a through the A/D conversion unit 82d where they are converted to digital signals.

At a time point t2, a signal TX1 shifts to high level, thereby setting the transistors M1 constituting the transfer units 25 in an ON state at the pixel 10 (1, 1) through the pixel (1, 4) in the first row. As a result, electric charges resulting from photoelectric conversion executed in a PD11 through a PD14 are respectively transferred to a capacitance FD11 through a capacitance FD14 at the individual floating diffusions 27. The electric charges having been transferred are accumulated in the capacitances FD11 through FD14 at the floating diffusions 27. In addition, since the signals SEL1a through SEL1f are at high level at the time point t2, pixel signals at the pixel 10 (1, 1) through the pixel 10 (1, 4) are respectively output to the vertical signal line 101a through the vertical signal line 101d via the corresponding amplifier units 28 and selection units 29. The pixel signals output from the pixels 10 in the first row to the vertical signal line 101a through the vertical signal line 101d are respectively input to the A/D conversion unit 82a through the A/D conversion unit 82d where they are converted to digital signals.

During a time period elapsing between a time point t3 and a time point t5, noise signals and pixel signals originating at the pixels 10(2, 1) through 10 (2, 4) in the second row are read out in the same way as the signals are read out over the time period elapsing between the time point t1 and the time point t3. Likewise, noise signals and pixel signals originating at the pixels 10 (3, 1) through 10 (3, 4) in the third row are read out over a time period elapsing between the time point t5 and a time point t7, and noise signals and pixel signals originating at the pixels 10 (4, 1) through 10 (4, 4) in the fourth row are read out over a time period elapsing between the time point t7 and a time point t9. In addition, the noise signals and the pixel signals, converted to digital signals at the A/D conversion units 82, are input to the output unit 100 via the horizontal scanning unit 90 shown in FIG. 2. The output unit 100 executes differential processing with respect to the noise signals and the pixel signals having originated in the pixels 10 through correlated double sampling. Through the embodiment described above, pixel signals at the pixels can be individually read out when the regions 41A through 44A constituting the Bayer array basic unit are each made up with a single pixel.

Figure 10:
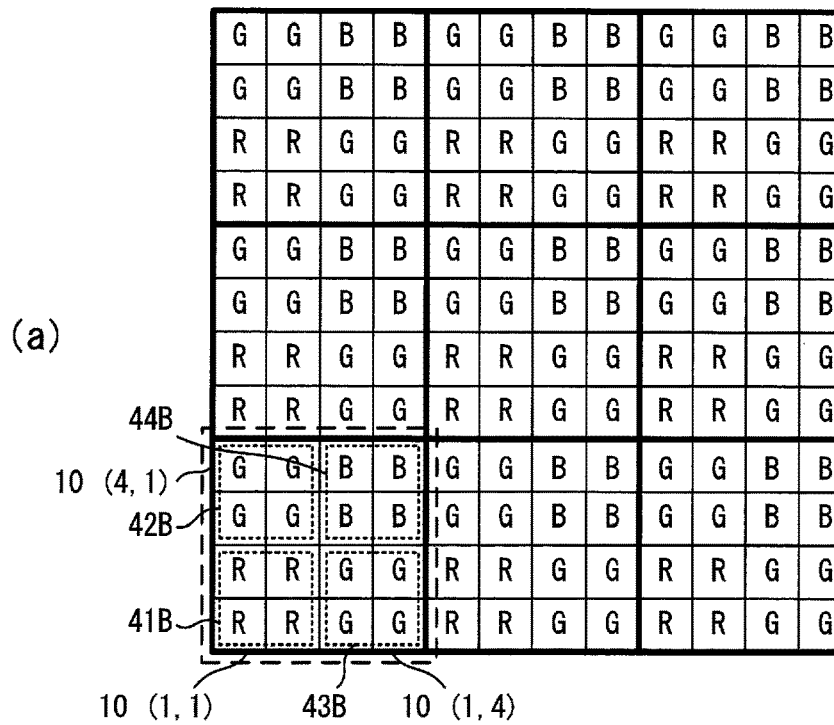
Figure 10:
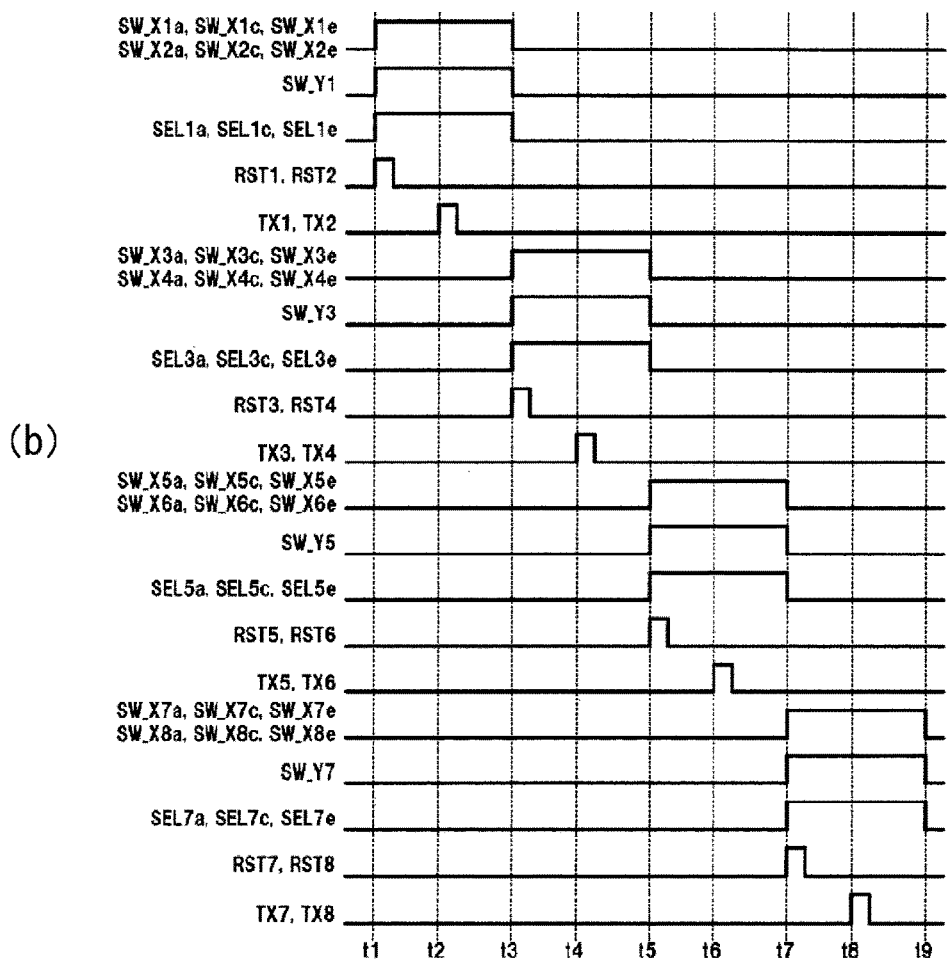

FIG. 10 presents another example of an operation that may be executed in the image sensor 3 in the first embodiment. FIG. 10(a) shows a Bayer array reiterating basic unit made up with 4×4 pixels present in regions 41B through 44B. FIG. 10(b) is a timing chart of an operation that may be executed in the image sensor 3 when the transmission wavelengths at the filter units 5 are set as shown in FIG. 10(a).

At a time point t1, a signal SW_X1a, a signal SW_X2a and a signal SW_Y1 shift to high level, thereby electrically connecting the capacitances at four pixels 10, i.e., the capacitance FD11 at the pixel 10 (1, 1), the capacitance FD12 at the pixel 10 (1, 2), the capacitance FD21 at the pixel 10 (2, 1) and the capacitance FD22 at the pixel 10 (2, 2), with one another. In addition, at the time point t1, a signal SW_X1c, a signal SW_X2c and the signal SW_Y1 shift to high level, thereby electrically connecting the capacitances at four pixels 10, i.e., the capacitance FD13 at the pixel 10 (1, 3), the capacitance FD14 at the pixel 10 (1, 4), the capacitance FD23 at the pixel 10 (2, 3) and the capacitance FD24 at the pixel 10 (2, 4), with one another.

Furthermore, at the time point t1, a signal RST1 and a signal RST2 shift to high level, thereby turning on the transistors M2 constituting the reset units 26 and setting the potentials at the floating diffusions 27 to the reset potential at the pixels 10 (1, 1) through (1, 4) and the pixels 10 (2, 1) through 10 (2, 4). In this situation, since the capacitances FD at the four pixels 10 are connected as explained earlier, the potentials at the floating diffusions 27 in the pixel 10 (1, 1), the pixel 10 (1, 2), the pixel 10 (2, 1) and the pixel 10 (2, 2) are averaged. In addition, the potentials at the floating diffusions 27 in the pixel 10 (1, 3), the pixel 10 (1, 4), the pixel 10 (2, 3) and the pixel 10 (2, 4) are averaged.

Additionally, as a signal SEL1a shifts to high level at the time point t1, a noise signal generated by averaging signals at the four pixels, i.e., the pixel 10 (1, 1), the pixel (1, 2), the pixel 10 (2, 1) and the pixel 10 (2, 2), is output to the vertical signal line 101a via the amplifier unit 28 and the selection unit 29 at the pixel 10 (1, 1). The noise signal output to the vertical signal line 101a is input to the A/D conversion unit 82a, which then converts it to a digital signal. Moreover, as a signal SEL1c shifts to high level at the time point t1, a noise signal generated by averaging signals at the four pixels, i.e., the pixel 10 (1, 3), the pixel 10 (1, 4), the pixel 10 (2, 3) and the pixel 10 (2, 4), is output to the vertical signal line 101c via the amplifier unit 28 and the selection unit 29 at the pixel (1, 3). The noise signal output to the vertical signal line 101c is input to the A/D conversion unit 82c, which then converts it to a digital signal.

At a time point t2, a signal TX1 and a signal TX2 shift to high level thereby turning on the transistors M1 constituting the transfer units 25 to transfer electric charges resulting from photoelectric conversion executed in the PDs 11 through 14 and the PDs 21 through PD24, to the corresponding floating diffusions 27 at the pixels 10 (1, 1) through (1, 4) and the pixels 10 (2, 1) through 10 (2, 4). Since the capacitances FD in the four pixels 10 are connected with one another as explained earlier, the electric charges transferred from the four corresponding PDs, i.e., the PD11, the PD12, the PD21 and the PD22, are distributed among the four capacitances FD11, FD12, FD21 and FD22. In addition, the electric charges transferred from the four PDs 13, 14, 23 and 24 are distributed among the four capacitances FD13, FD14, FD23 and FD24.

At the time point t2, the signal SEL1a is at high level and thus, a sum pixel signal generated by averaging signals at the four pixels, i.e., the pixel 10 (1, 1), the pixel 10 (1, 2), the pixel 10 (2, 1) and the pixel 10 (2, 2), is output to the vertical signal line 101a via the amplifier unit 28 and the selection unit 29 at the pixel 10 (1, 1). The sum pixel signal output to the vertical signal line 101a is input to the A/D conversion unit 82a which then converts it to a digital signal. Furthermore, at the time point t2, the signal SEL1c is at high level and thus, a sum pixel signal generated by averaging signals at the four pixels, i.e., the pixel 10 (1, 3), the pixel 10 (1, 4), the pixel 10 (2, 3) and the pixel 10 (2, 4), is output to the vertical signal line 101c via the amplifier unit 28 and the selection unit 29 at the pixel 10 (1, 3). The sum pixel signal output to the vertical signal line 101c is input to the A/D conversion unit 82c which then converts it to a digital signal.

The noise signals and the sum pixel signals having been converted to digital signals at the A/D conversion units 82 are input to the output unit 100 via the horizontal scanning unit 90 shown in FIG. 2. The output unit 100 executes differential processing to determine the differences between the noise signals and the sum pixel signals originating at the pixels 10 through correlated double sampling.

During a time period elapsing between a time point t3 and a time point t5, signals generated by adding together and averaging signals at the pixel 10 (3, 1), the pixel 10 (3, 2), the pixel 10 (4, 1) and the pixel 10 (4, 2) and signals generated by adding together and averaging signals generated at the pixel 10 (3, 3), the pixel 10 (3, 4), the pixel 10 (4, 3) and the pixel 10 (4, 4) are read out in the same way as signals are read out during the time period elapsing between the time point t1 and the time point t3. During a time period elapsing between the time point t5 and a time point t7, signals generated by adding together and averaging signals at the pixel 10 (5, 1), the pixel 10 (5, 2), the pixel 10 (6, 1) and the pixel 10 (6, 2) and signals generated by adding together and averaging signals generated at the pixel 10 (5, 3), the pixel 10 (5, 4), the pixel 10 (6, 3) and the pixel 10 (6, 4) are read out in the same way as signals are read out during the time period elapsing between the time point t1 and the time point t3. In this embodiment, a signal can be read out by adding together the signals at the four pixels present in each region in conjunction with a Bayer array basic unit constituted with the regions 41B through 44B, each made up with 2×2=4 pixels.

In addition, a sum pixel signal obtained by adding together the signals generated at the four pixels is read out to the vertical signal line 101a or the vertical signal line 101c in the example presented in FIG. 10. Since this allows current generation at the current sources 81b and 81d, connected to the vertical signal lines 101b and 101d, to which no sum pixel signals are read out, to be stopped, the level of current consumption in the image sensor 3 can be lowered.

Figure 11:
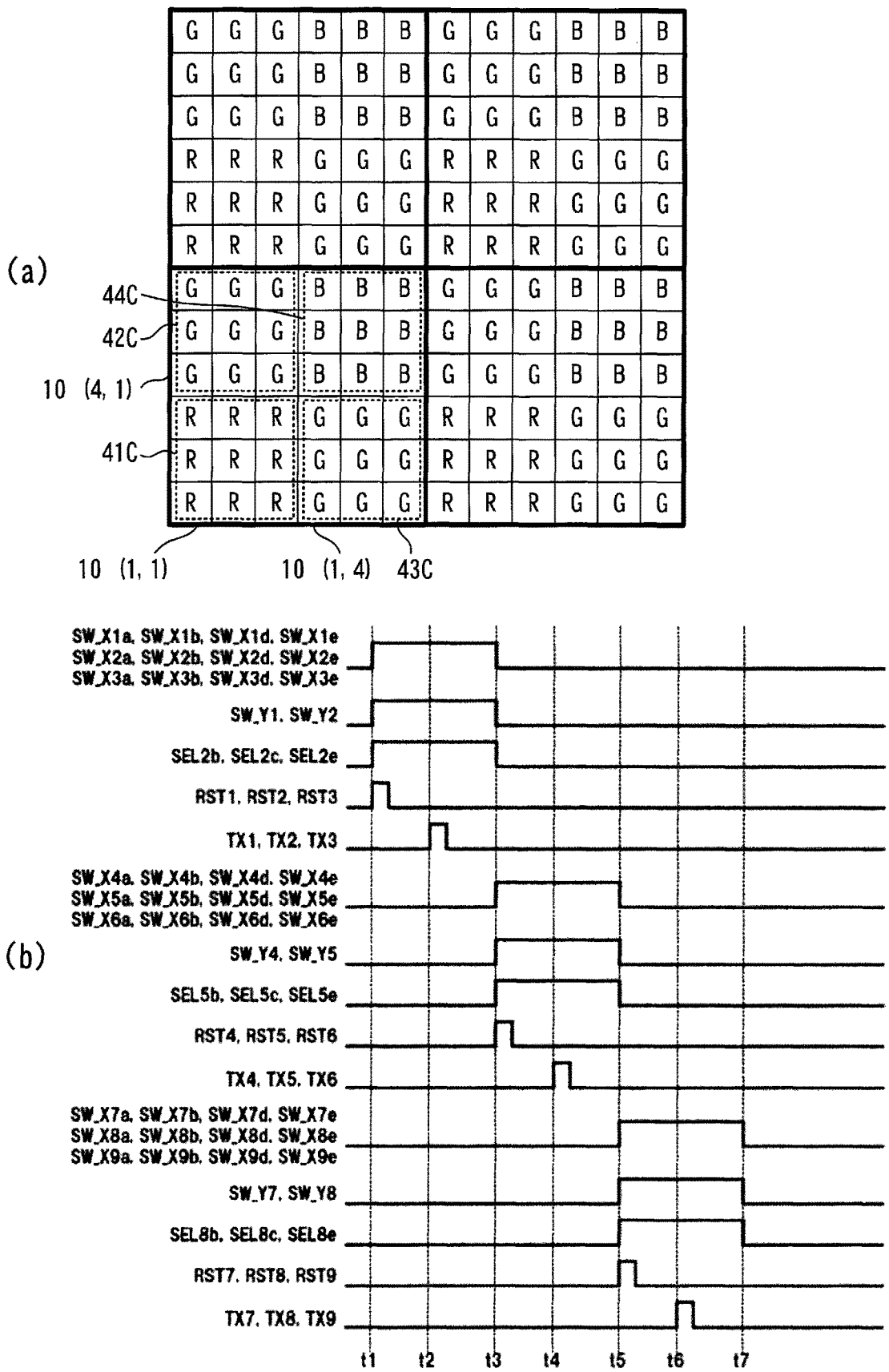

FIG. 11 presents yet another example of an operation that may be executed in the image sensor 3 in the first embodiment. FIG. 11(a) shows a Bayer array reiterating basic unit made up with 6×6 pixels present in regions 41C through 44C. FIG. 11(b) is a timing chart of an operation that may be executed in the image sensor 3 when the transmission wavelengths at the filter units 5 are set as shown in FIG. 11(a).

At a time point t1, a signal SW_X1a, a signal SW_X1b, a signal SW_X2a, a signal SW_X2b, a signal SW_X3a, a signal SW_X3b, a signal SW_Y1 and a signal SW_Y2 shift to high level, thereby electrically connecting the capacitances at nine pixels 10, i.e., the capacitance FD11 at the pixel 10 (1, 1), the capacitance FD12 at the pixel 10 (1, 2), the capacitance FD13 at the pixel 10 (1, 3), the capacitance FD21 at the pixel 10 (2, 1), the capacitance FD22 at the pixel 10 (2, 2), the capacitance FD23 at the pixel 10 (2, 3), the capacitance FD31 at the pixel 10 (3, 1), the capacitance FD32 at the pixel 10 (3, 2) and the capacitance FD33 at the pixel 10 (3, 3) with one another.

In addition, at the time point t1, a signal RST1, a signal RST2 and a signal RST3 shift to high level, thereby turning on the transistors M2 constituting the reset units 26 and setting the potentials at the floating diffusions 27 to the reset potential at the pixels 10 (1, 1) through 10 (1, 3), the pixels 10 (2, 1) through 10 (2, 3) and the pixels 10 (3, 1) through (3, 3). In this case, the potentials at the floating diffusions 27 are averaged in the capacitances FD at the nine pixels 10 listed above.

Furthermore, as a signal SEL2b shifts to high level at the time point t1, a noise signal generated by averaging signals at the nine pixels is output to the vertical signal line 101b via the amplifier unit 28 and the selection unit 29 at the pixel 10 (2, 2). The noise signal output to the vertical signal line 101b is input to the A/D conversion unit 82b, which then converts it to a digital signal.

At a time point t2, a signal TX1, a signal TX2 and a signal TX3 shift to high level, thereby turning on the transistors M1 constituting the transfer units 25 to transfer electric charges resulting from photoelectric conversion executed at the PDs 11 through 13, the PDs 21 through 23 and the PDs 31 through 33 to the corresponding floating diffusions 27 at the pixels 10 (1, 1) through 10 (1, 3), the pixels 10 (2, 1) through 10 (2, 3) and the pixels 10 (3, 1) through 10 (3, 3). The electric charges transferred from the nine PDs, i.e., the PD11 through the PD13, the PD21 through the PD23, and the PD31 through the PD33, are distributed among the nine capacitances FD11, FD12, FD13, FD21, FD22, FD23, FD31, FD32 and FD33.

In addition, at the time point t2, the signal SEL2b is at high level and thus, a sum pixel signal generated by averaging signals generated at the nine pixels is output to the vertical signal line 101b via the amplifier unit 28 and the selection unit 29 at the pixel 10 (2, 2). The sum pixel signal output to the vertical signal line 101b is input to the A/D conversion unit 82b which then converts it to a digital signal. In this embodiment, a signal can be read out by adding together the signals at the nine pixels present in each region in conjunction with a Bayer array basic unit constituted with the regions 41C through 44C, each made up with 3×3=9 pixels.

In addition, a sum pixel signal obtained by adding together the signals generated at the nine pixels is read out to the vertical signal line 101b in the example presented in FIG. 11. Since this allows current generation at the current sources 81a and 81c, connected to the vertical signal lines 101a and 101c, to which no sum pixel signals are read out, to be stopped, the level of current consumption in the image sensor 3 can be lowered.

It is to be noted that while addition processing for adding together signals generated at the individual pixels is executed within the pixels 10 in the embodiment described above, the pixel signals generated at the pixels 10 may be individually output to the output unit 100 and addition processing may be executed in the output unit 100, instead.

The power consumption and the length of time required for signal readout are bound to increase if the signals from all the pixels 10 are to be read out individually in an image sensor 3 having a very large number of pixels, to satisfy the requirements of, for instance, surveillance or industrial applications. In the embodiment, the size of the area that includes R, G and B filter units 5 is altered while sustaining the Bayer array pattern so as to make it possible to output a signal generated by adding together the signals generated at a plurality of pixels 10 adjacent to one another. Since the signals generated at adjacent pixels are added together, the level of noise in the signal and the current consumption can both be lowered in comparison to signal generation executed by adding together signals generated at pixels at positions set apart from one another. In addition, since the signals from adjacent pixels are added together, the length of time required for the addition processing can be reduced over the length of time required for addition processing executed by adding together signals at pixels disposed at positions set apart from one another, which makes it possible to reduce the length of time required for pixel signal readout.

The following advantages and operations are achieved through the embodiment described above.

(1) The image sensor 3 includes a plurality of filter units 5, the transmission wavelength of which can be adjusted, a plurality of photoelectric conversion units 34 that receive light having been transmitted through the filter units 5 and a control unit (filter control unit 60) that alters the size of a first region that contains a first filter unit 5, among the plurality of filter units 5, which allows light at a first wavelength to be transmitted and enter a photoelectric conversion unit 34. This structure enables the filter control unit 60 to alter the size of a region 41 that includes an R pixel, a region 42 and a region 43 each of which includes a G pixel, and a region 44 that includes a B pixel, by controlling the individual filter units 5. In addition, the filter control unit 60 is able to alter the size of a Bayer array basic unit by controlling the filter units 5 so as to set the same transmission wavelength range for the filter units 5 in a plurality of pixels adjacent to one another.

(2) The filter control unit 60 in the embodiment alters the size of the regions 41 through 44 while sustaining the Bayer array pattern. This means that a signal generated by adding together the signals generated at a plurality of pixels 10 adjacent to one another can be output. Since signals at same-color pixels adjacent to one another are added together, the level of noise in the signal and the level of current consumption can be lowered in comparison to levels of noise and current consumption in an image sensor that generates a signal by adding together signals generated at same-color pixels disposed at positions set apart from one another. In addition, the length of time required for pixel signal readout can be reduced in comparison to the length of time required to read out signals each generated by adding together signals generated at pixels disposed at positions set apart from one another.

SECOND EMBODIMENT

Figure 12:
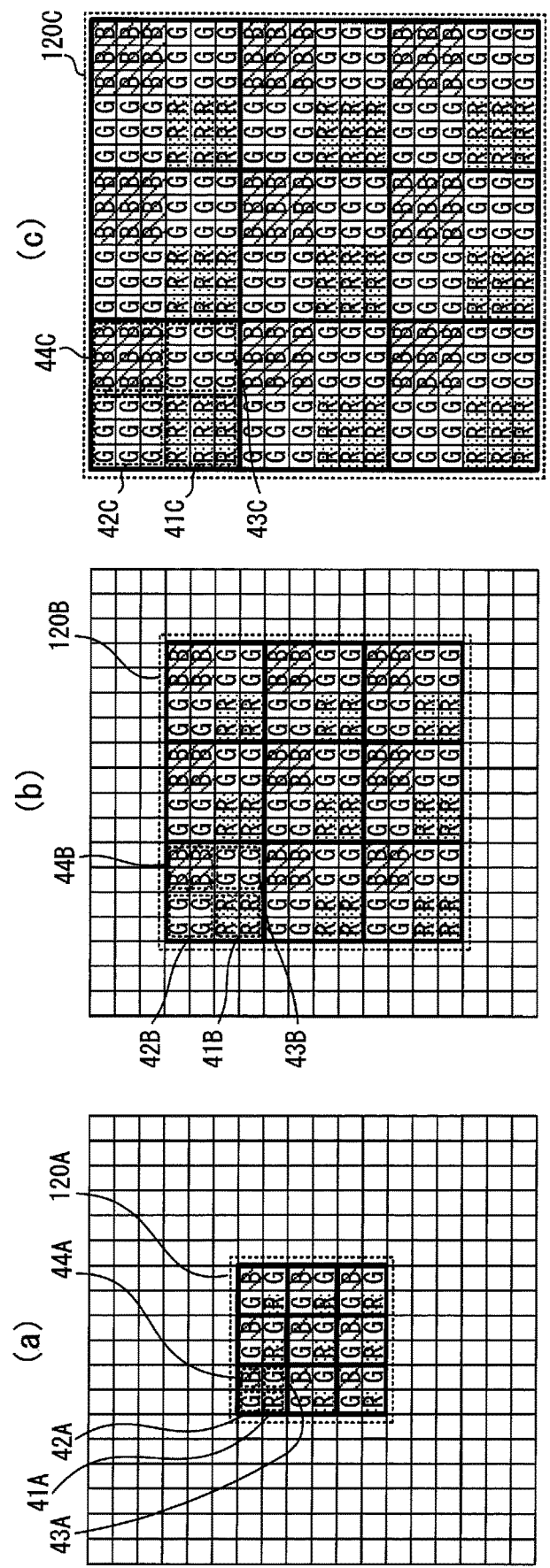

In reference to FIG. 12, the image sensor in the second embodiment will be described. The image sensor 3 in the second embodiment adjusts the pixel signal readout area, to an area 120A, 120B or 120C in correspondence the zoom magnification factor selected for the electronic zoom function of the electronic camera 1, and adjusts the transmission wavelength ranges for the filter units 5 in the pixels 10 present in the readout areas 120A through 120C, as indicated in FIGS. 6(a) through 6(c).

FIG. 12(a) shows the pixel signal readout area 120A set when a relatively high magnification factor is set for the electronic zoom function and the array pattern with which R pixels, G pixels and B pixels are set within the readout area 120A. FIG. 12(b) shows the pixel signal readout area 120B set when an intermediate magnification factor is set for the electronic zoom function and the array pattern with which R pixels, G pixels and B pixels are set within the readout area 120B. FIG. 12(c) shows the pixel signal readout area 120C set when a relatively low magnification factor is set for the electronic zoom function and the array pattern with which R pixels, G pixels and B pixels are set within the readout area 120C.

The readout area 120A in FIG. 12(a) includes a Bayer array reiterating basic unit made up with 2×2=4 pixels, i.e., one R pixel, two G pixels and one B pixel. Namely, in the readout area 120A, a region 41A where a single R pixel is present, a region 42A and a region 43A each containing a single G pixel, and a region 44A where a single B pixel is present constitute the Bayer array basic unit, in the same manner as shown in FIG. 6(a). Such regions 41A, 42A 43A and 44A are set by controlling the filter units 5 in the individual pixels 10 via the filter control unit 5.

The readout area 120A for high magnification zoom is selected by ensuring that the number of pixels 10 in the readout area 120A substantially matches the number of display pixels disposed at an external display device with a relatively high resolution that is utilized by, for instance, the photographer when viewing photographic image data. It is to be noted that the selection may be made by the photographer as he enters the number of display pixels at the display device into the camera 1 by operating an operation member (not shown) at the electronic camera 1 and sets the readout area 120A based upon the entered number of display pixels thus input. Pixel signals generated at the pixels 10 within the readout area 120A are read out through processing similar to the readout processing described in reference to FIG. 8.

For purposes of simplifying the illustration, the readout area 120A in the example presented in FIG. 12(a) contains 6×6 pixels. Namely, in the example presented in FIG. 12(a), i.e., in high magnification zoom, the image sensor 3 outputs 36 pixel signals.

The readout area 120B in FIG. 12(b), selected for electronic zoom at an intermediate magnification factor, is set greater than the readout area 120A corresponding to a high magnification factor shown in FIG. 12(a). In more specific terms, it is set to take up an area four times the area of the readout area 120A. In the readout area 120B, a region 41B, where 2×2=4 R pixels are present, a region 42B and a region 43B each containing 2×2=4 G pixels, and a region 44B where 2×2=4 B pixels are present are set in a Bayer array pattern, in the same manner as shown in FIG. 6(b). Such regions 41B, 42B, 43B and 44B are set by controlling the filter units 5 in the individual pixels 10 via the filter control unit 5.

The image sensor 3 reads out a sum pixel signal generated by adding together pixel signals at the four R pixels in the region 41B and reads out a sum pixel signal generated by adding together pixel signals at the four G pixels in the region 42B in the readout area 120B. Likewise, the image sensor 3 reads out a sum pixel signal generated by adding together pixel signals at the four G pixels in the region 43B and reads out a sum pixel signal generated by adding together pixel signals at the four B pixels in the region 44B in the readout area 120B. Namely, in the example presented in FIG. 12(b), i.e., in intermediate magnification zoom, the image sensor 36 outputs sum pixel signals just as it outputs 36 pixel signals for high magnification zoom.

The readout area 120C in FIG. 12(c), selected for electronic zoom at a low magnification factor, is set even greater than the readout area 120B corresponding to an intermediate magnification factor shown in FIG. 12(b). In more specific terms, it is set to take up an area nine times the area of the readout area 120A for high magnification zoom. In the readout area 120C, a region 41C, where 3×3=9 R pixels are present, a region 42C and a region 43C each containing 3×3=9 G pixels, and a region 44C where 3×3=9 B pixels are present are set in a Bayer array pattern, in the same manner as shown in FIG. 6(c). Such regions 41C, 42C, 43C and 44C are set by controlling the filter units 5 in the individual pixels 10 via the filter control unit 5.

The image sensor 3 reads out a sum pixel signal generated by adding together pixel signals at the nine R pixels in the region 41C and reads out a sum pixel signal generated by adding together pixel signals at the nine G pixels in the region 42C in the readout area 120C. Likewise, the image sensor 3 reads out a sum pixel signal generated by adding together pixel signals at the nine G pixels in the region 43C and reads out a sum pixel signal generated by adding together pixel signals at the nine B pixels in the region 44C in the readout area 120C. Namely, in the example presented in FIG. 12(c), i.e., in low magnification zoom, the image sensor 3 outputs 36 sum pixel signals just as it outputs 36 signals for high magnification zoom and intermediate magnification zoom.

As described above, the filter control unit 60 in the second embodiment controls the filter units 5 in the individual pixels 10 so as to set a single R pixel in the region 41A in FIG. 12(a), set four R pixels in the region 41B in FIG. 12(b) and set nine R pixels in the region 41C in FIG. 12(c). Likewise, the filter control unit 60 sets a single G pixel in each of the regions 42A and 43A in FIG. 12(a), sets four G pixels in each of the regions 42B and 43B in FIG. 12(b) and sets nine G pixels in each of the regions 42C and 43C in FIG. 12(c). Likewise, the filter control unit 60 sets a single B pixel in the region 44A in FIG. 12(a), sets four B pixels in the region 44B in FIG. 12(b) and sets nine B pixels in the region 44C in FIG. 12(c). Thus, the filter control unit 60 is able to set a fixed number of pixel signals or sum pixel signals to be output from the image sensor 3 regardless of the zoom magnification setting by adjusting the size of a filter unit 5, which is controlled to assume a given transmission wavelength range, in correspondence to the electronic zoom magnification setting.

The image sensor 3 in the embodiment as described above is capable of outputting a fixed number of pixel signals or sum pixel signals in correspondence to all the zoom magnification settings that may be selected for electronic zooming, and is thus able to sustain a given level of resolution for images to be brought up at display devices.

In addition to advantages and operations similar to those of the first embodiment, the following advantage and operation are achieved through the embodiment described above.

(3) The total number of signals obtained via a plurality of photoelectric conversion units 34 having received light transmitted through a plurality of first filter units under first control and the total number of sum signals generated by adding together signals generated via a plurality of photoelectric conversion units 34 having received light transmitted through a first region under second control are substantially equal to each other. The total number of signals obtained through a plurality of photoelectric conversion units 34 having received light transmitted through a plurality of second filter units under the first control and the total number of sum signals generated by adding together signals generated via a plurality of photoelectric conversion units 34 having received light transmitted through a second region under the second control are substantially equal to each other. As a result, the same number of pixel signals or sum pixel signals can be output at all the zoom magnification settings that may be selected for electronic zooming. Ultimately, a uniform resolution can be sustained in images displayed at display devices.

The following variations are also within the scope of the present invention, and one of the variations or a plurality of variations may be adopted in combination with either of the embodiments described above.

Variation 1

Figure 13:
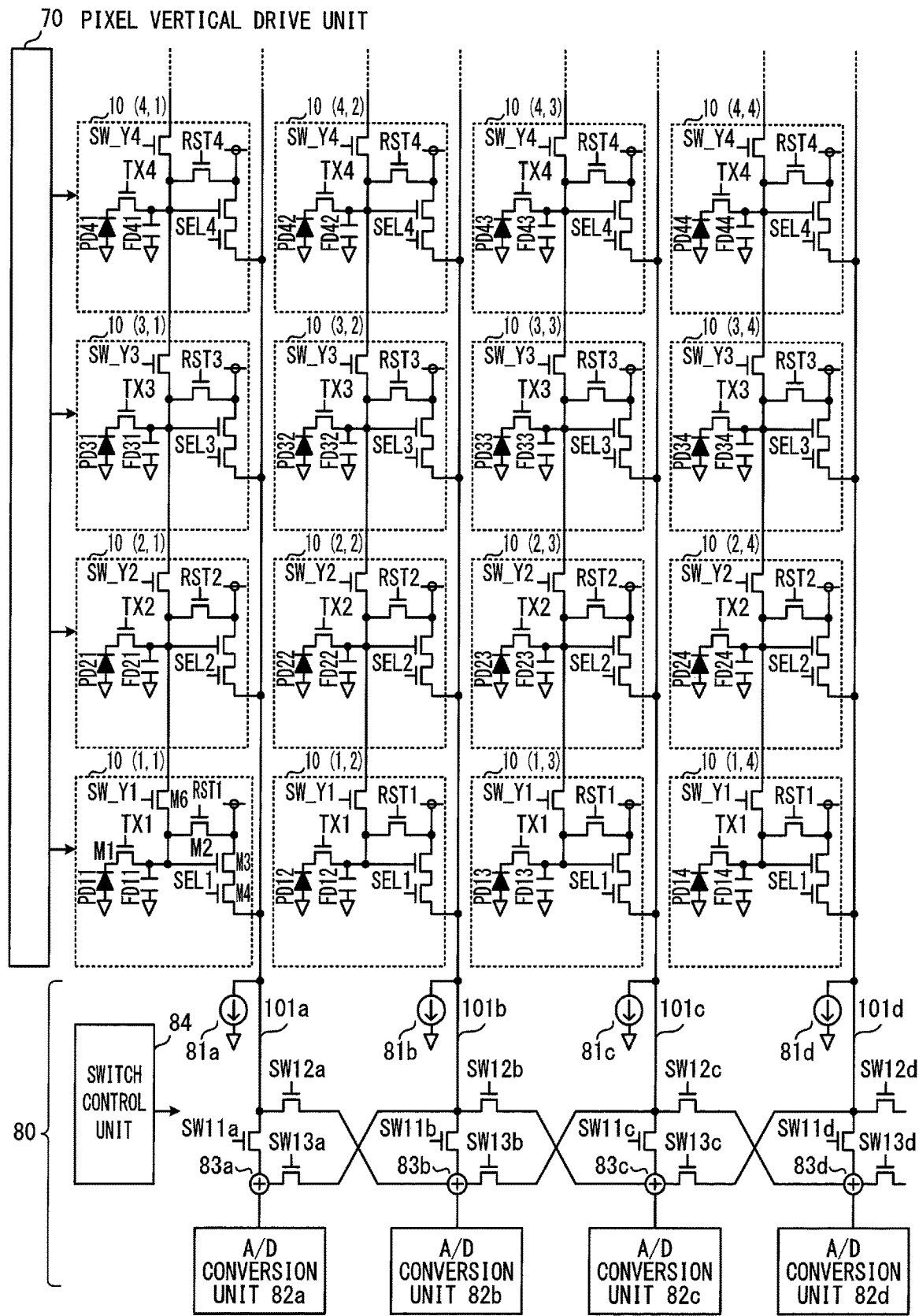

In reference to drawings, the image sensor 3 in variation 1 will be explained. It is to be noted that in the figures, the same reference signs are assigned to elements identical to or equivalent to those in the first embodiment and that the following explanation will focus on features differentiating the image sensor in variation 1 from the image sensor 3 in the first embodiment. FIG. 13 is a circuit diagram showing the structure in part of the image sensor 3 in variation 1. The column circuit unit 80 includes switch units SW11 (SW11a through SW11f), switch units SW12 (SW12a through SW12f), switch units SW13 (SW13a through SW13f), arithmetic operation circuit units 83 (arithmetic operation circuit units 83a through 83f), and a switch control unit 84. A switch unit SW11, a switch unit SW12, a switch unit SW13 and an arithmetic operation circuit unit 83 are disposed in correspondence to each pixel column made up with a plurality of pixels 10 disposed side-by-side along the column direction, i.e., along the longitudinal direction. In addition, the pixels 10 in variation 1 do not include first switch units 18.

ON/OFF control of the switch unit SW11, the switch unit SW12 and the switch unit SW13 is executed by the switch control unit 84. The arithmetic operation circuit unit 83, which may be constituted with, for instance, an amplifier circuit, has a function of executing addition processing for adding together a plurality of signals input thereto. In the embodiment, the pixel vertical drive unit 70, the second switch units 19, the capacitances FD, the switch unit SW11, the switch unit SW12, the switch unit SW13 and the arithmetic operation circuit unit 83 together function as an adder unit that adds together signals from the photoelectric conversion units 34.

Figure 14:
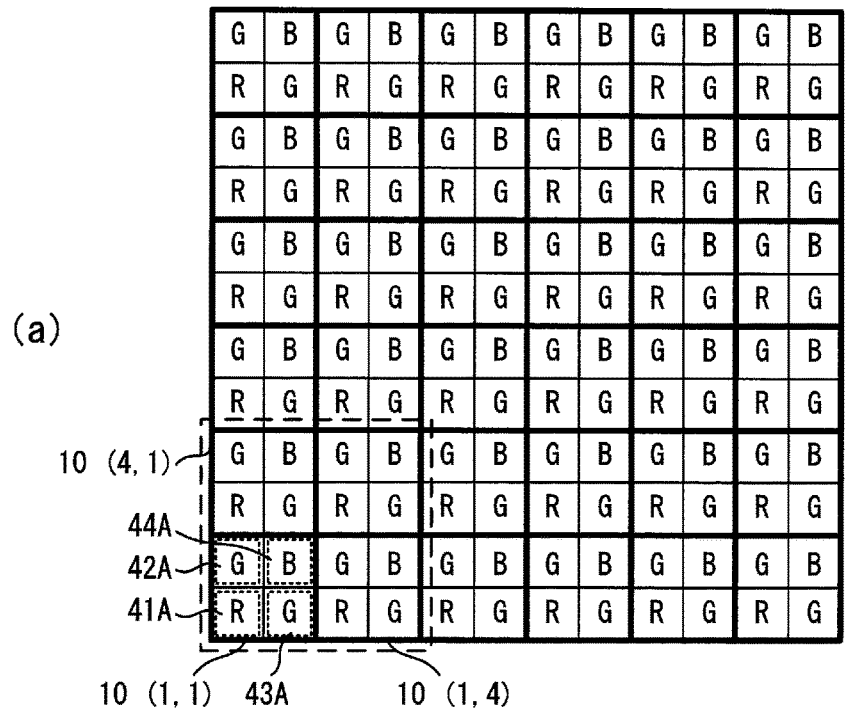
FIG. 14 Diagrams in reference to which an example of an operation that may be executed in the image sensor in variation 1 will be explained FIG. 15 Diagrams in reference to which another example of an operation that may be executed in the image sensor in variation 1 will be explained FIG. 16 Diagrams in reference to which yet another example of an operation that may be executed in the image sensor in variation 1 will be explained FIG. 17 A circuit diagram showing the structure adopted in part of the image sensor in the variation 2
Figure 14:
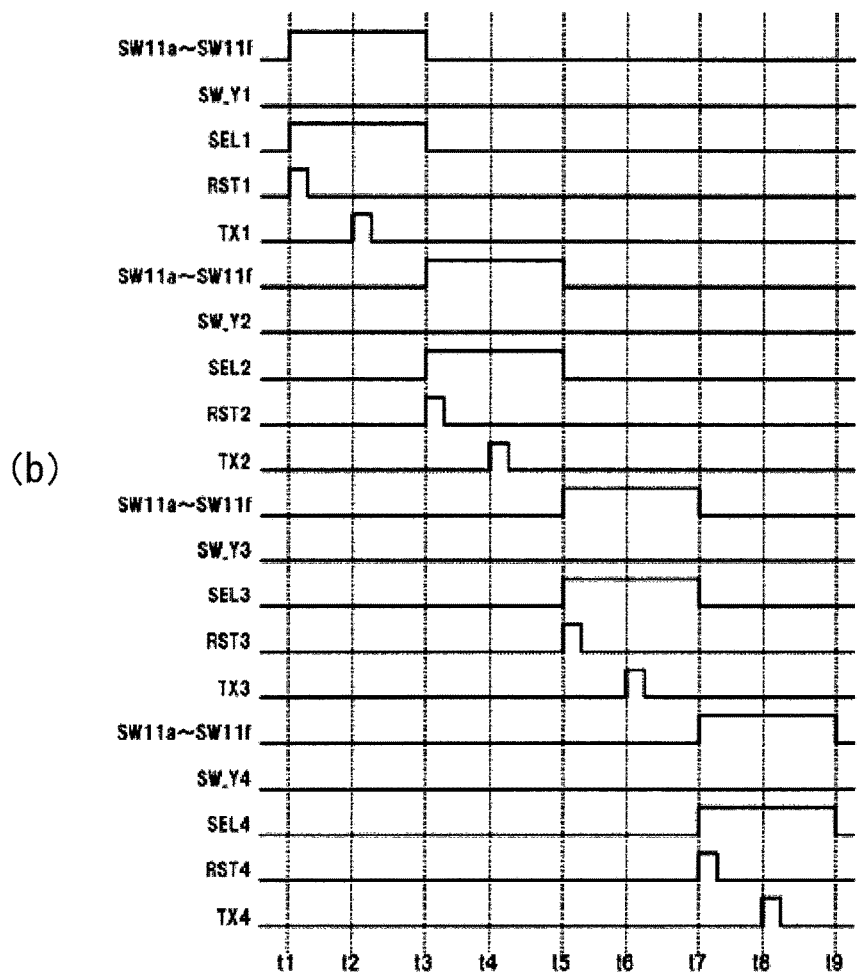

FIG. 14 illustrates how an operation may be executed in the image sensor 3 in variation 1. FIG. 14(a) presents an example in which a Bayer array reiterating basic unit is made up with 2×2 pixels each present in one of regions 41A through 44A. FIG. 14(b) is a timing chart of an operation that may be executed in the image sensor 3 when the transmission wavelengths are set for the filter units 5 as shown in FIG. 14(a). In FIG. 14(b), time points are indicated along the horizontal axis. In addition, SW11 (SW11a through SW11f), SW12 (SW12a through SW12f) and SW13 (SW13a through SW13f) respectively indicate control signals input to the switch units SW11 (SW11a through SW11f), the switch units SW12(SW12a through SW12f) and the switch units SW13(SW13a through SW13f). In the timing chart in FIG. 14(b), a transistor, to which a high-level control signal (e.g., at the source potential) is input, enters an ON state and a transistor, to which a low-level control signal (e.g., at the ground potential) is input, enters an OFF state.

At a time point t1, a signal RST1 shifts to high level, thereby setting the transistors M2 constituting the reset units 26 in an ON state and setting the potentials at the floating diffusions 27 to the reset potential at the pixels 10 (1, 1) through 10 (1, 4) in the first row. In addition, at the time point t1, a signal SEL1 shifts to high level and, as a result, noise signals originating at the pixel 10 (1, 1) through the pixel 10 (1, 4) are respectively output to the vertical signal lines 101a through 101d via the transistor M3 constituting the amplifier units 28 and the transistors M4 constituting the selection units 29. As signals SW11a through SW11d shift to high level at the time point t1, the noise signals from the individual pixels 10 in the first row, having been output to the vertical signal lines 101a through 101d, are respectively input to the arithmetic operation circuit unit 83a through the arithmetic operation circuit unit 83d. The arithmetic operation circuit units 83a through 83d output the signals input thereto to the A/D conversion unit 82a through the A/D conversion unit 82d respectively. The A/D conversion units 82a through 82d convert the signals input thereto to digital signals.

At a time point t2, a signal TX1 shifts to high level, thereby setting the transistors M1 constituting the transfer units 25 in an ON state at the pixel 10 (1, 1) through the pixel (1, 4) in the first row. As a result, electric charges, resulting from photoelectric conversion executed at the PD11 through the PD14 are respectively transferred to the capacitance FD11 through the capacitance FD14 at the individual floating diffusions 27. In addition, since the signal SEL1 is at high level at the time point t2, pixel signals generated at the pixel 10 (1, 1) through the pixel 10 (1, 4) are respectively output to the vertical signal lines 101a through 101d via the corresponding amplifier units 28 and selection units 29. Moreover, since the signals SW11a through SW11d are at high level at the time point t2, the pixel signals output from the pixels 10 in the first row to the vertical signal lines 101a through 101d are respectively input, via the arithmetic operation circuit units 83a through 83d, to the A/D conversion unit 82a through the A/D conversion unit 82d where they are converted to digital signals.

During a time period elapsing between a time point t3 and a time point t5, noise signals and pixel signals originating at the pixels 10 (2, 1) through 10 (2, 4) in the second row are read out in the same way as signals are read out over the time period elapsing between the time point t1 and the time point t3. Likewise, noise signals and pixel signals originating at the pixels 10 (3, 1) through 10 (3, 4) in the third row are read out over a time period elapsing between the time point t5 and a time point t7, and noise signals and pixel signals originating at the pixels 10 (4, 1) through 10 (4, 4) in the fourth row are read out over a time period elapsing between the time point t7 and a time point t9. Through variation 1 described above, pixel signals generated at the pixels can be individually read out when the regions 41A through 44A constituting the Bayer array basic unit are each made up with a single pixel, as in the first embodiment.

Figure 15:
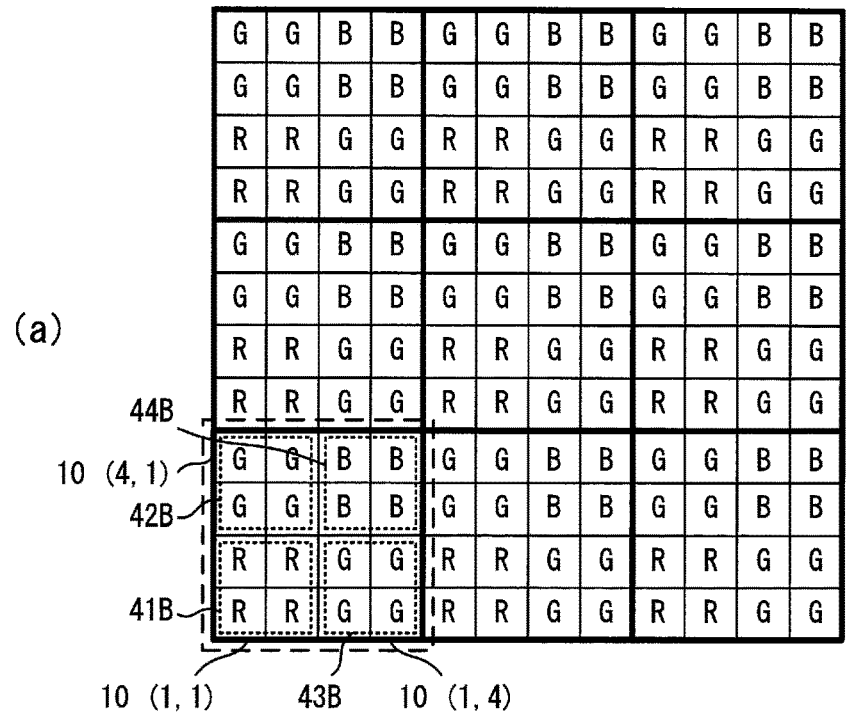
Figure 15:
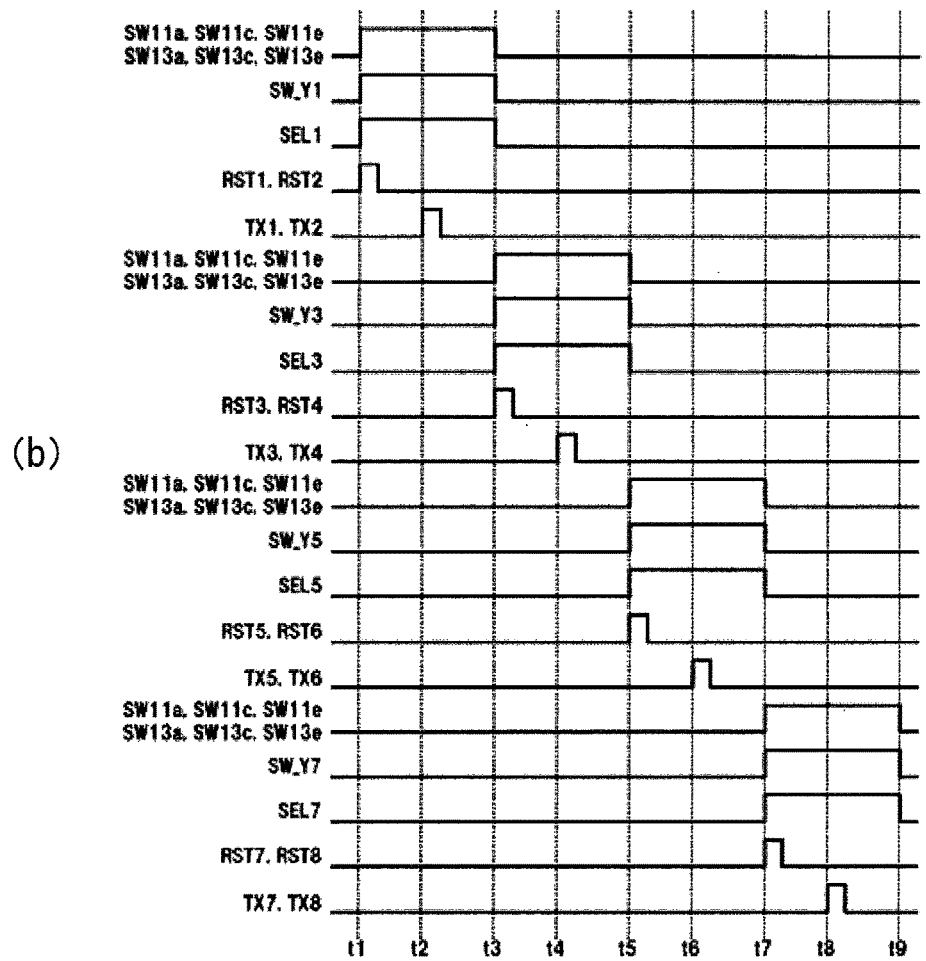

FIG. 15 presents another example of an operation that may be executed in the image sensor 3 in variation 1. FIG. 15(a) shows a Bayer array reiterating basic unit made up with 4×4 pixels present in regions 41B through 44B. FIG. 15(b) is a timing chart of an operation that may be executed in the image sensor 3 when the transmission wavelengths at the filter units 5 are set as shown in FIG. 15(a).

At a time point t1, a signal SW_Y1 shifts to high level, thereby electrically connecting the capacitances at pixels 10, i.e., the capacitance FD11 and the capacitance FD21 at the pixels 10 (1, 1) and 10 (2, 1), the capacitance FD12 and the capacitance FD22 at the pixels 10 (1, 2) and 10 (2, 2), the capacitance FD13 and the capacitance FD23 at the pixels 10 (1, 3) and 10 (2, 3) and the capacitance FD14 and the capacitance FD24 at the pixels 10 (1, 4) and 10 (2, 4) are electrically connected with each other.

In addition, at the time point t1, a signal RST1 and a signal RST2 shift to high level, thereby turning on the transistors M2 constituting the reset units 26 and setting the potentials at the floating diffusions 27 to the reset potential at the pixels 10 (1, 1) through (1, 4) and the pixels 10 (2, 1) through 10 (2, 4).

At the time point t1, as a signal SEL1 shifts to high level, a noise signal generated by averaging signals at the two pixels 10 (1, 1), and 10 (2, 1) is output to the vertical signal line 101a via the amplifier unit 28 and the selection unit 29 at the pixel 10 (1, 1). In addition, as the signal SEL1 shifts to high level at the time point t1, a noise signal generated by averaging signals at the two pixels 10 (1, 2), and 10 (2, 2), a noise signal generated by averaging signals at the two pixels 10 (1, 3), and 10 (2, 3) and a noise signal generated by averaging signals at the two pixels 10 (1, 4), and 10 (2, 4) are respectively output to the vertical signal line 101b through the vertical signal line 101d.

At the time point t1, a signal SW11a, a signal SW11c, a signal SW13a and a signal SW13c also shift to high level. It is to be noted that a signal SW11b, a signal SW11d, a signal SW13b, a signal SW13d and the signals SW12a through SW12d are each set to low level. As a result, the noise signal generated by averaging the signals at the two pixels 10 (1,1) and 10 (2, 1) output to the vertical signal line 101a and the noise signal generated by averaging the signals at the two pixels 10 (1, 2) and 10 (2, 2) output to the vertical signal line 101b are input to the arithmetic operation circuit unit 83a where they are added together and averaged. Namely, the arithmetic operation circuit unit 83a generates a noise signal representing the average of the signals at the four pixels, i.e., the pixel 10 (1,1), the pixel 10 (2, 1), the pixel 10 (1, 2) and the pixel 10 (2, 2), and outputs the noise signal thus generated to the A/D conversion unit 82a. The A/D conversion unit 82a then converts the signal input thereto to a digital signal.

Likewise, the noise signal generated by averaging the signals at the two pixels 10 (1, 3) and 10 (2, 3) output to the vertical signal line 101c and the noise signal generated by averaging the signals at the two pixels 10 (1, 4) and 10 (2, 4) output to the vertical signal line 101d are input to the arithmetic operation circuit unit 83c where they are added together and averaged. Namely, the arithmetic operation circuit unit 83c generates a noise signal representing the average of the signals at the four pixels, i.e., the pixel 10 (1, 3), the pixel 10 (2, 3), the pixel 10 (1, 4) and the pixel 10 (2, 4), and outputs the noise signal thus generated to the A/D conversion unit 82c. The A/D conversion unit 82c then converts the signal input thereto to a digital signal.

At a time point t2, a signal TX1 and a signal TX2 shift to high level, thereby turning on the transistors M1 constituting the transfer units 25 to transfer electric charges resulting from photoelectric conversion executed at the PD11 through the PD14 and at the PD21 through the PD24 to the corresponding floating diffusions at the pixels 10 (1, 1) through 10 (1, 4) and the pixels 10 (2, 1) through 10 (2, 4).

In addition, at the time point t2, a sum pixel signal generated by averaging signals at the two pixels 10 (1, 1) and 10 (2, 1) is output to the vertical signal line 101a. Furthermore, at the time point t2, a sum pixel signal generated by averaging signals at the two pixels 10 (1, 2) and 10 (2, 2), a sum pixel signal generated by averaging signals at the two pixels 10 (1, 3) and 10 (2, 3) and a sum pixel signal generated by averaging signals at the two pixels 10 (1, 4) and 10 (2, 4) are respectively output to the vertical signal line 101b through the vertical signal line 101d.

Also at the time point t2, the sum pixel signal generated by averaging the signals at the two pixels 10 (1, 1) and 10 (2, 1) output to the vertical signal line 101a, and the sum pixel signal generated by averaging the signals at the two pixels 10 (1, 2) and 10 (2, 2) output to the vertical signal line 101b, are input to the arithmetic operation circuit unit 83a where they are added together and averaged. Namely, the arithmetic operation circuit unit 83a generates a sum pixel signal representing the average of the signals at the four pixels, i.e., the pixel 10 (1,1), the pixel 10 (2, 1), the pixel 10 (1, 2) and the pixel 10 (2, 2), and outputs the sum pixel signal thus generated to the A/D conversion unit 82a. The A/D conversion unit 82a then converts the signal input thereto to a digital signal.

Likewise, the sum pixel signal generated by averaging the signals at the two pixels (1, 3) and 10 (2, 3) output to the vertical signal line 101c, and the sum pixel signal generated by averaging the signals at the two pixels 10 (1, 4) and 10 (2, 4) output to the vertical signal line 101d, are input to the arithmetic operation circuit unit 83*c* where they are added together and averaged. Namely, the arithmetic operation circuit unit 83*c* generates a sum pixel signal representing the average of the signals at the four pixels, i.e., the pixel 10 (1,3), the pixel 10 (2, 3), the pixel 10 (1, 4) and the pixel 10 (2, 4), and outputs the sum pixel signal thus generated to the A/D conversion unit 82*c*. The A/D conversion unit 82*c* then converts the signal input thereto to a digital signal.

During a time period elapsing between a time point t3 and a time point t5, signals generated by adding together and averaging signals generated at the pixel 10 (3, 1), the pixel 10 (3, 2), the pixel 10 (4, 1) and the pixel 10 (4, 2) and signals generated by adding together and averaging signals generated at the pixel 10 (3, 3), the pixel 10 (3, 4), the pixel (4, 3) and the pixel 10 (4, 4) are read out in the same way as signals are read out during the time period elapsing between the time point t1 and the time point t3. During a time period elapsing between the time point t5 and a time point t7, signals generated by adding together and averaging signals at the pixel 10 (5, 1), the pixel 10 (5, 2), the pixel 10 (6, 1) and the pixel 10 (6, 2) and signals generated by adding together and averaging signals generated at the pixel 10 (5, 3), the pixel 10 (5, 4), the pixel 10 (6, 3) and the pixel 10 (6, 4) are read out in the same way as signals read out during the time period elapsing between the time point t1 and the time point t3. In the above described manner, a signal can be read out by adding together the signals at four pixels present in each region in conjunction with a Bayer array basic unit constituted with the regions 41B through 44B, each made up with 2×2=4 pixels.

Figure 16:
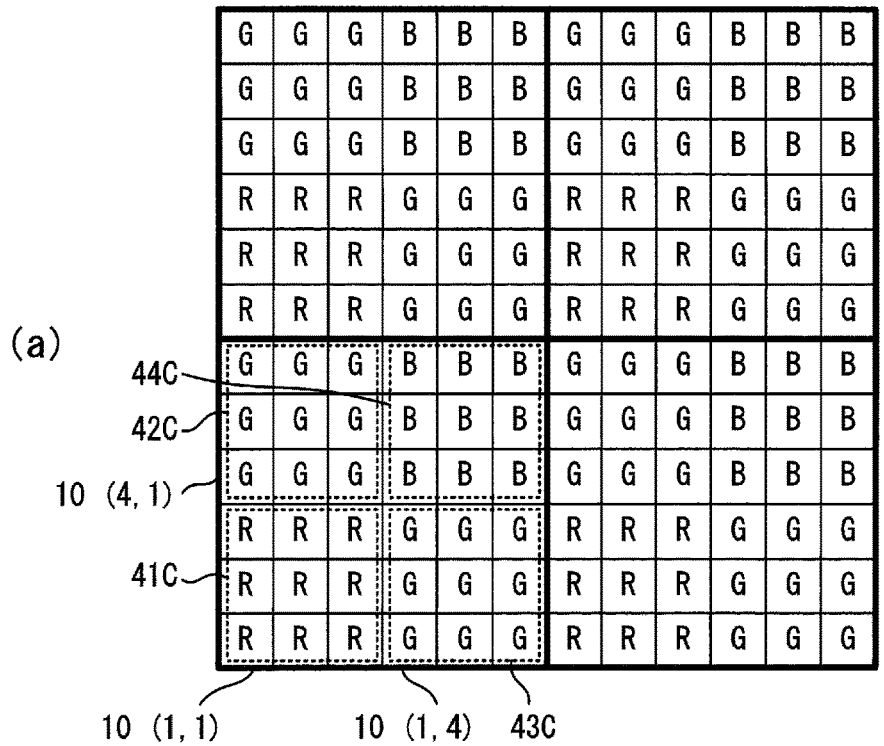
Figure 16:
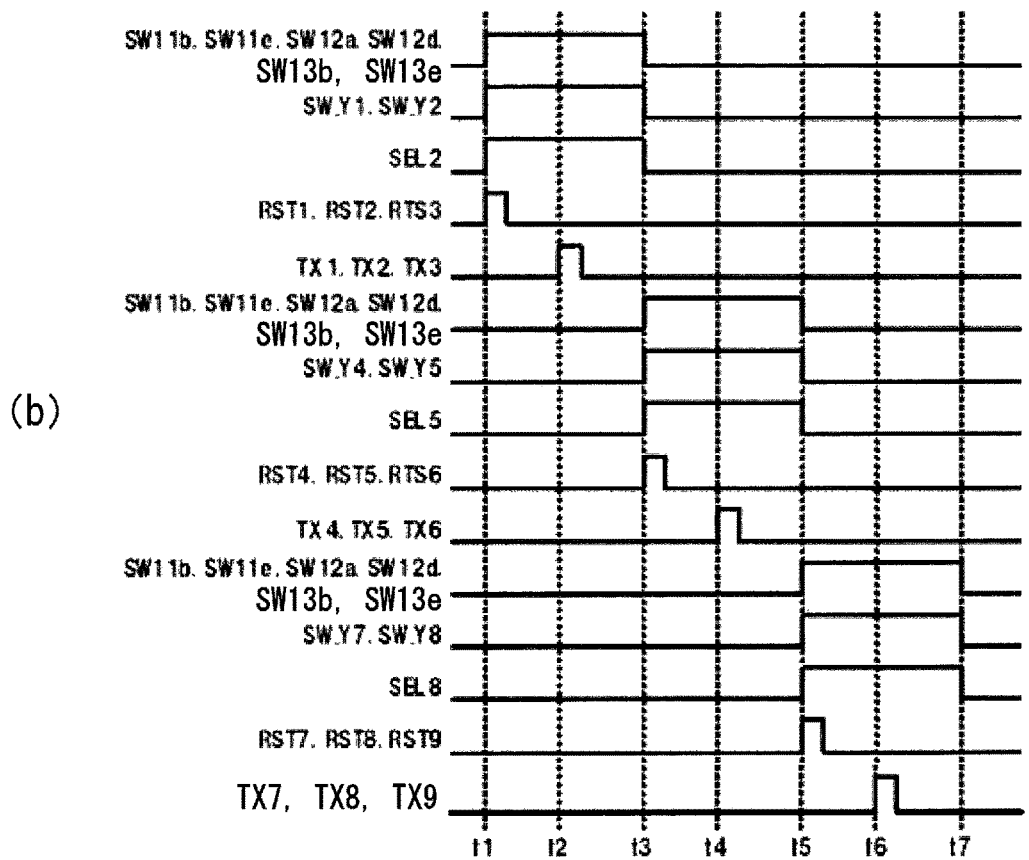

FIG. 16 presents yet another example of an operation that may be executed in the image sensor 3 in variation 1. FIG. 16(*a*) shows a Bayer array reiterating basic unit made up with 6×6 pixels present in regions 41C through 44C. FIG. 16(*b*) is a timing chart of an operation that may be executed in the image sensor 3 when the transmission wavelengths at the filter units 5 are set as shown in FIG. 16(*a*).

At a time point t1, a signal SW_Y1 and a signal SW_Y2 shift to high level, thereby electrically connecting capacitances, i.e., the capacitance FD11 at the pixel 10 (1, 1), the capacitance FD21 at the pixel 10 (2, 1) and the capacitance FD31 at the pixel 10 (3, 1), with one another. In addition, the capacitance FD12 at the pixel 10 (1, 2), the capacitance FD22 at the pixel 10 (2, 2) and the capacitance FD32 at the pixel 10 (3, 2), become electrically connected with one another. The capacitance FD13 at the pixel 10 (1, 3), the capacitance FD23 at the pixel 10 (2, 3) and the capacitance FD33 at the pixel 10 (3, 3), become electrically connected with one another.

In addition, at the time point t1, a signal RST1, a signal RST2 and a signal RST3 shift to high level, thereby turning on the transistors M2 constituting the reset units 26 and setting the potentials at the floating diffusions 27 to the reset potential at the pixels 10 (1, 1) through 10 (1, 3), the pixels 10 (2, 1) through 10 (2, 3) and the pixels 10 (3, 1) through (3, 3). In this situation, the potentials of the floating diffusions 27 are averaged among the capacitances FD electrically connected with one another.

Furthermore, as a signal SEL2 shifts to high level at the time point t1, a noise signal generated by averaging signals at the three pixels 10 (1, 1), 10 (2, 1) and 10 (3, 1), is output to the vertical signal line 101*a* via the amplifier unit 28 and the selection unit 29 at the pixel 10 (2, 1). As the signal SEL2 shifts to high level at the time point t1, a noise signal generated by averaging signals at the three pixels 10 (1, 2), 10 (2, 2) and 10 (3, 2), is output to the vertical signal line 101*b* via the amplifier unit 28 and the selection unit 29 at the pixel 10 (2, 2). As the signal SEL2 shifts to high level at the time point t1, a noise signal generated by averaging signals at the three pixels 10 (1, 3), 10 (2, 3) and 10 (3, 3), is output to the vertical signal line 101*c* via the amplifier unit 28 and the selection unit 29 at the pixel 10 (2, 3).

At the time point t1, a signal SW12*a*, a signal SW11*b* and a signal SW13*b* shift to high level. It is to be noted that a signal SW11*a*, a signal SW13*a*, a signal SW12*b*, a signal SW11*c*, a signal SW12*c* and a signal SW13*c* are all set to low level. As a result, the noise signals output to the vertical signal line 101*a* through the vertical signal line 101*c* are input to the arithmetic operation circuit unit 83*b* where they are added together and averaged. Namely, the arithmetic operation circuit unit 83*b* generates a noise signal representing the average of the signals at the nine pixels, i.e., the pixel 10 (1,1), the pixel (1, 2), the pixel 10 (1, 3), the pixel 10 (2,1), the pixel 10 (2, 2), the pixel 10 (2, 3), the pixel 10 (3,1), the pixel 10 (3, 2) and the pixel 10 (3, 3), and outputs the noise signal thus generated to the A/D conversion unit 82*b*. The A/D conversion unit 83*b* then converts the signal input thereto to a digital signal.

At a time point t2, a signal TX1, a signal TX2 and a signal TX3 shift to high level, thereby turning on the transistors M1 constituting the transfer units 25 to transfer electric charges resulting from photoelectric conversion executed at the PD11 through the PD13, the PD21 through the PD23 and the PD31 through the PD33 to the corresponding floating diffusions 27 at the pixels 10 (1, 1) through 10 (1, 3), the pixels 10 (2, 1) through 10 (2, 3) and the pixels 10 (3, 1) through 10 (3, 3).

In addition, at the time point t2, a sum pixel signal generated by averaging signals at the three pixels 10 (1, 1), 10 (2, 1) and 10 (3, 1) is output to the vertical signal line 101*a*. Furthermore, at the time point t2, a sum pixel signal generated by averaging signals at the three pixels 10 (1, 2), 10 (2, 2) and 10 (3, 2), and a sum pixel signal generated by averaging signals at the three pixels 10 (1, 3), 10 (2, 3) and 10 (3, 3) are respectively output to the vertical signal line 101*b* and the vertical signal line 101*c*.

Also at the time point t2, the sum pixel signals output to the vertical signal line 101*a* through the vertical signal line 101*c* are input to the arithmetic operation circuit unit 83*b* where they are added together and averaged. Namely, the arithmetic operation circuit unit 83*b* generates a sum pixel signal representing the average of the signals at the nine pixels, and outputs the sum pixel signal thus generated to the A/D conversion unit 82*b*. The A/D conversion unit 82*b* then converts the signal input thereto to a digital signal. In the above described manner, the image sensor 3 is thus able to read out a signal by adding together the signals at nine pixels present in each region in conjunction with a Bayer array basic unit constituted with the regions 41C through 44C, each made up with 3×3=9 pixels.

Variation 2

Figure 17:
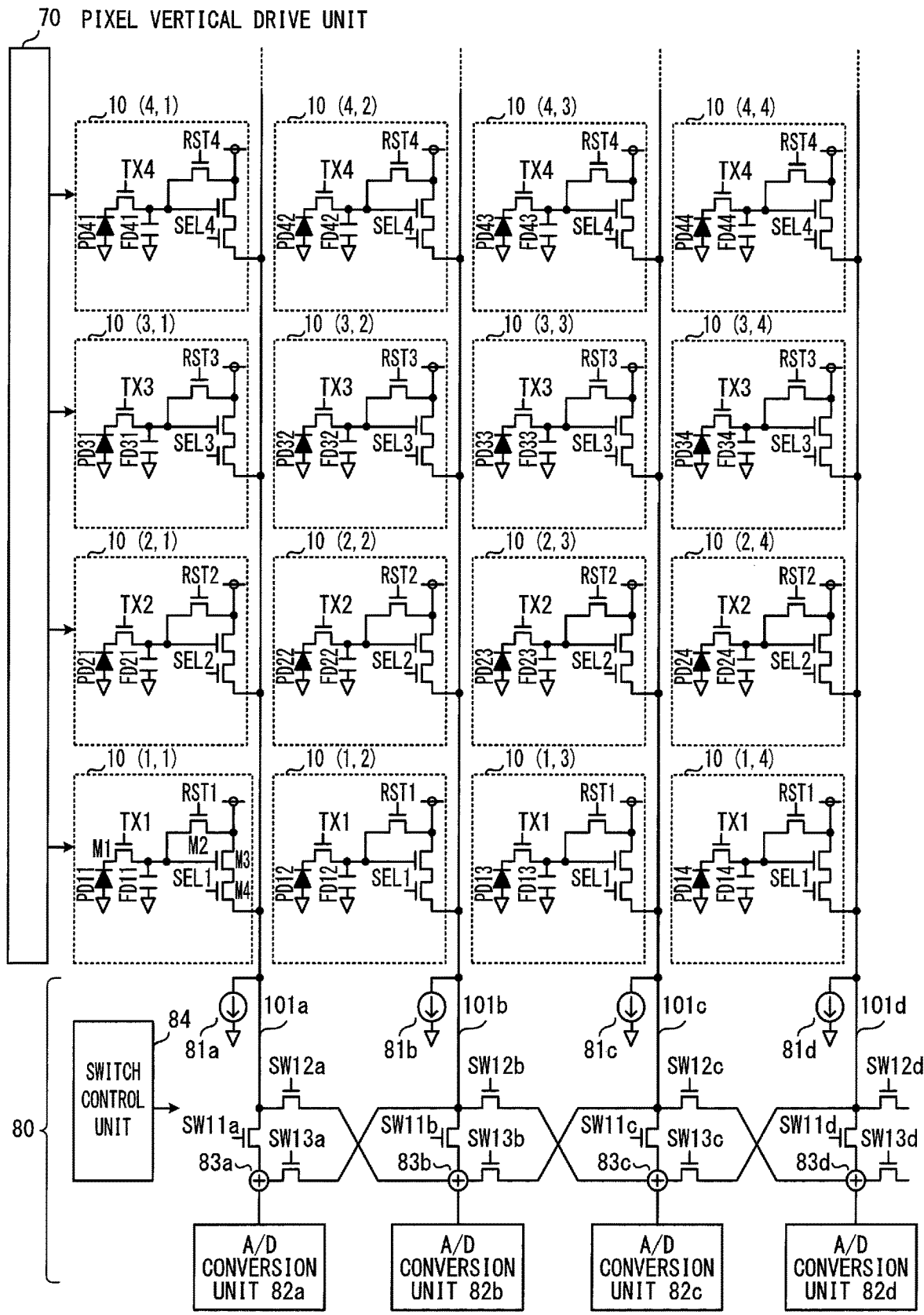

In reference to drawings, the image sensor 3 in variation 2 will be explained. It is to be noted that in the figures, the same reference signs are assigned to elements identical to or equivalent to those in the first embodiment and variation 1, and that the following explanation will focus on features differentiating the image sensor in this variation from the image sensor 3 in the first embodiment and variation 1. FIG. 17 is a circuit diagram showing the structure in part of the image sensor 3 in variation 2. The pixels 10 in variation 2 adopt a structure that does not include the first switch unit 18 or the second switch unit 19. In variation 2, the pixel vertical drive unit 70, a switch unit SW11, a switch unit SW12, a switch unit SW13 and an arithmetic operation circuit unit 83 together function as an adder unit that adds together signals from the photoelectric conversion units 34.

Figure 18:
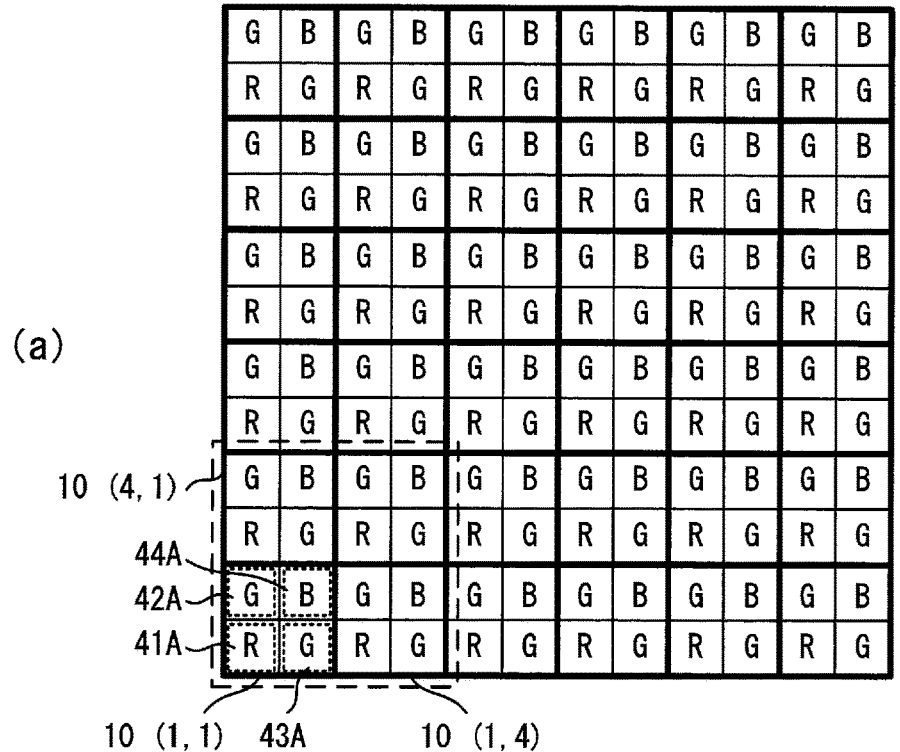
FIG. 18 Diagrams in reference to which an example of an operation that may be executed in the image sensor in variation 2 will be explained FIG. 19 Diagrams in reference to which another example of an operation that may be executed in the image sensor in variation 2 will be explained FIG. 20 Diagrams in reference to which yet another example of an operation that may be executed in the image sensor in variation 2 will be explained FIG. 21 A circuit diagram showing the structure adopted in part of the image sensor in variation 3
Figure 18:
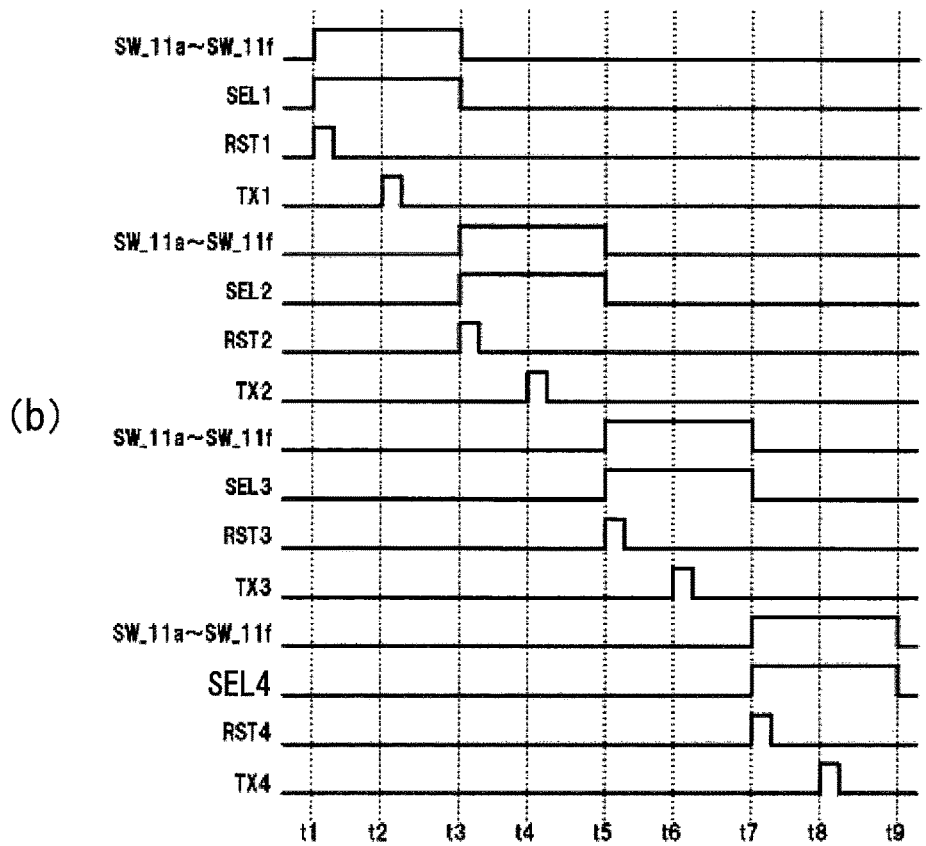

FIG. 18 illustrates how an operation may be executed in the image sensor 3 in variation 2. FIG. 18(a) presents an example in which a Bayer array reiterating basic unit is made up with 2×2 pixels each present in one of regions 41A through 44A. FIG. 18(b) is a timing chart of an operation that may be executed in the image sensor 3 when the transmission wavelengths are set for the filter units 5 as shown in FIG. 18(a). In FIG. 18(b), time points are indicated along the horizontal axis.

At a time point t1, a signal RST1 shifts to high level, thereby setting the transistors M2 constituting the reset units 26 in an ON state and setting the potentials at the floating diffusions 27 to the reset potential at the pixels 10 (1, 1) through 10 (1, 4) in the first row. In addition, at the time point t1, a signal SEL1 shifts to high level and, as a result, noise signals originating at the pixel 10 (1, 1) through the pixel 10 (1, 4) are respectively output to the vertical signal line 101a through the vertical signal line 101d via the transistors M3 constituting the amplifier units 28 and the transistors M4 constituting the selection units 29. As signals SW11a through SW11f shift to high level at the time point t1, the noise signals from the individual pixels 10 in the first row, having been output to the vertical signal line 101a through the vertical signal line 101d, are input to the A/D conversion unit 82a through the A/D conversion unit 82d respectively via the arithmetic operation circuit unit 83a through the arithmetic operation circuit unit 83d. The A/D conversion units 82a through 82d convert the signals input thereto to digital signals.

At a time point t2, a signal TX1 shifts to high level, thereby setting the transistors M1 constituting the transfer units 25 in an ON state at the pixels 10 (1, 1) through 10 (1, 4) in the first row. As a result, electric charges resulting from photoelectric conversion executed at the PDs 11 through 14 are respectively transferred to the capacitance FD11 through the capacitance FD14. In addition, since the signal SEL1 is at high level at the time point t2, pixel signals generated at the pixels 10 (1, 1) through 10 (1, 4) are respectively output to the vertical signal line 101a through the vertical signal line 101d via the corresponding amplifier units 28 and selection units 29. Furthermore, since the signals SW11a through SW11d are at high level at the time point t2, the pixel signals output from the pixels 10 in the first row to the vertical signal line 101a through the vertical signal line 101d are respectively input via the arithmetic operation circuit units 83a through 83d, to the A/D conversion unit 82a through the A/D conversion unit 82d where they are converted to digital signals.

During a time period elapsing between a time point t3 and a time point t5, noise signals and pixel signals originating at pixels 10 (2, 1) through 10 (2, 4) in the second row are read out in the same way as signals are read out over the time period elapsing between the time point t1 and the time point t3. Likewise, noise signals and pixel signals originating at the pixels 10 (3, 1) through 10 (3, 4) in the third row are read out over a time period elapsing between the time point t5 and a time point t7, and noise signals and pixel signals originating at the pixels 10 (4, 1) through 10 (4, 4) in the fourth row are read out over a time period elapsing between the time point t7 and a time point t9. Through variation 2 described above, pixel signals generated at the pixels can be individually read out when the regions 41A through 44A constituting the Bayer array basic unit are each made up with a single pixel, as in the first embodiment and variation 1.

Figure 19:
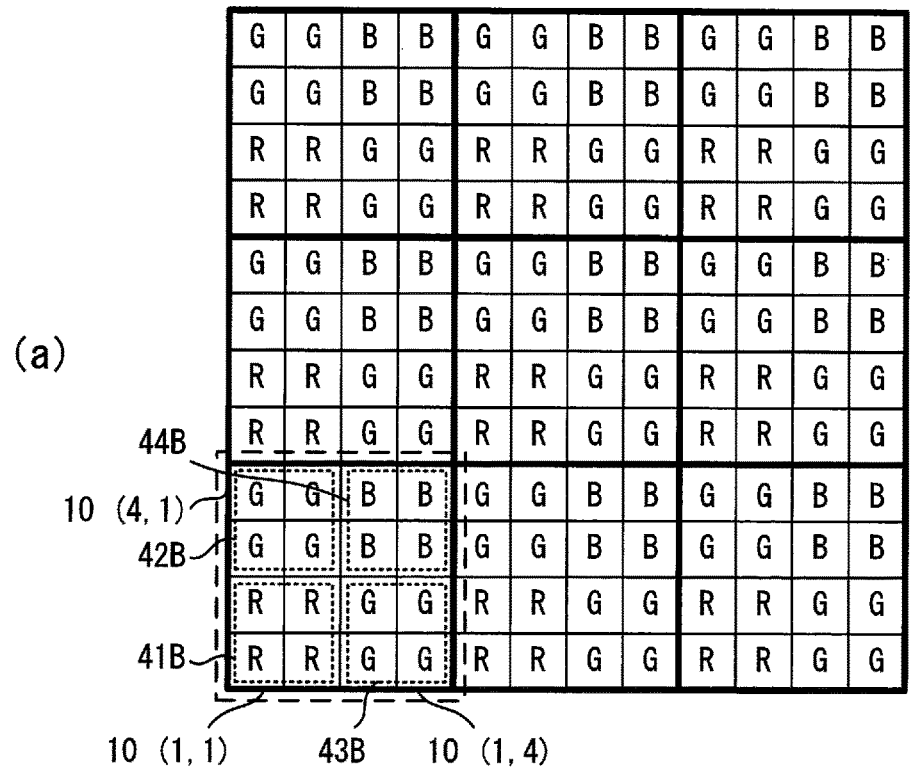
Figure 19:
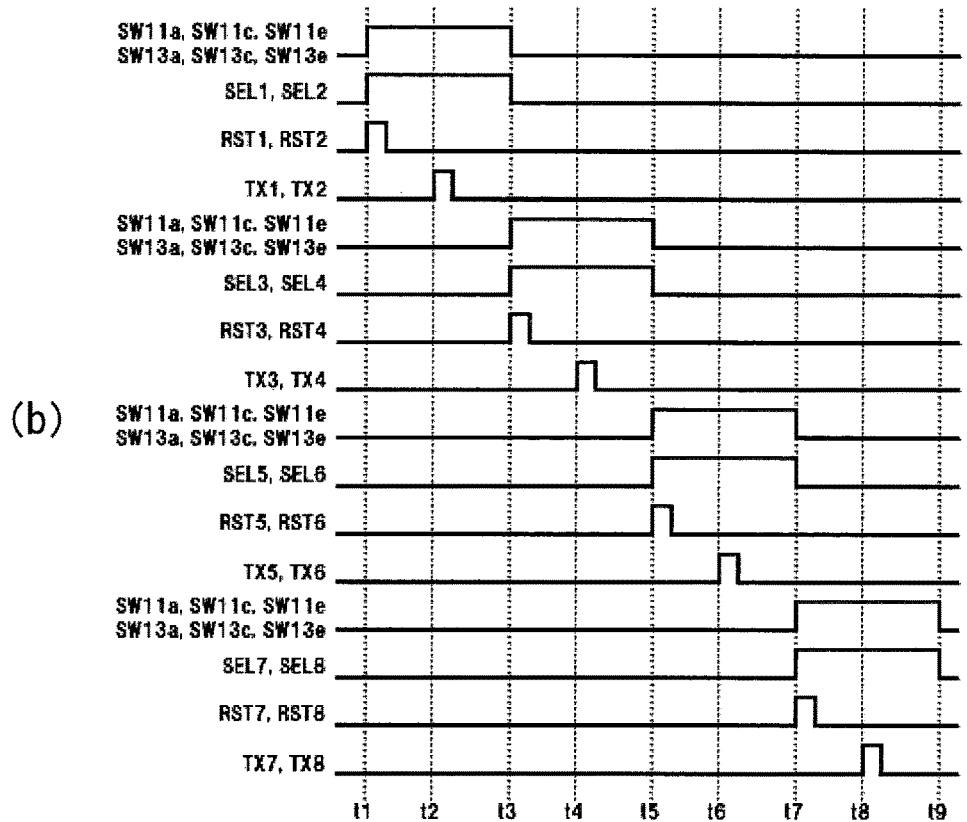

FIG. 19 presents another example of an operation that may be executed in the image sensor 3 in variation 2. FIG. 19(a) shows a Bayer array reiterating basic unit made up with 4×4 pixels present in regions 41B through 44B. FIG. 19(b) is a timing chart of an operation that may be executed in the image sensor 3 when the transmission wavelengths at the filter units 5 are set as shown in FIG. 19(a).

At a time point t1, a signal RST1 and a signal RST2 shift to high level, thereby turning on the transistors M2 constituting the reset units 26 and setting the potentials at the floating diffusions 27 to the reset potential at the pixels 10 (1, 1) through 10 (1, 4) and the pixels 10 (2, 1) through 10 (2, 4).

As a signal SEL1 and a signal SEL2 shift to high level at the time point t1, the source terminals of the transistors M3 constituting the amplifier units 28 at the pixel 10 (1, 1) and the pixel 10 (2, 1) become electrically connected with each other via the vertical signal line 101a. Thus, a noise signal generated by adding together and averaging signals at the two pixels 10 (1, 1) and 10 (2, 1), is output to the vertical signal line 101a. The noise signal output to the vertical signal line 101a is a signal corresponding to the average (value) of the potentials at the floating diffusions 27 in the pixel 10 (1, 1) and the pixel 10 (2, 1).

In addition, as the signal SEL1 and the signal SEL2 shift to high level at the time point t1, the amplifier unit 28 in the pixel 10 (1, 2) and the amplifier unit 28 in the pixel 10 (2, 2) become electrically connected with each other via the vertical signal line 101a. Thus, a noise signal generated by adding together and averaging signals at the two pixels (1, 2) and 10 (2, 2), is output to the vertical signal line 101b. Likewise, as the signal SEL1 and the signal SEL2 shift to high level at the time point t1, a noise signal generated by averaging signals at two pixels 10 (1, 3) and 10 (2, 3), and a noise signal generated by averaging signals at the two pixels 10 (1, 4) and 10 (2, 4) are respectively output to the vertical signal line 101c and the vertical signal line 101d.

At the time point t1, a signal SW11a, a signal SW11c, a signal SW13a and a signal SW13c also shift to high levels. It is to be noted that a signal SW11b, a signal SW11d, a signal SW13b, a signal SW13d and the signals SW12a through SW12d are each set to low level. As a result, the noise signal generated by averaging the signals at the two pixels 10 (1,1) and 10 (2, 1) output to the vertical signal line 101a and the noise signal generated by averaging the signals at the two pixels 10 (1, 2) and 10 (2, 2) output to the vertical signal line 101b are input to the arithmetic operation circuit unit 83a where they are added together and averaged. Namely, the arithmetic operation circuit unit 83a generates a noise signal representing the average of the signals at the four pixels, i.e., the pixel 10 (1,1), the pixel 10 (2, 1), the pixel 10 (1, 2) and the pixel 10 (2, 2), and outputs the noise signal thus generated to the A/D conversion unit 82a. The A/D conversion unit 82a then converts the signal input thereto to a digital signal.

Likewise, the noise signal generated by averaging the signals at the two pixels 10 (1, 3) and 10 (2, 3) output to the vertical signal line 101c and the noise signal generated by averaging the signals at the two pixels 10 (1, 4) and 10 (2, 4) output to the vertical signal line 101d are input to the arithmetic operation circuit unit 83c where they are added together and averaged. Namely, the arithmetic operation circuit unit 83c generates a noise signal representing the average of the signals at the four pixels, i.e., the pixel 10 (1, 3), the pixel 10 (2, 3), the pixel 10 (1, 4) and the pixel 10 (2, 4), and outputs the noise signal thus generated to the A/D conversion unit 82*c*. The A/D conversion unit 82*c* then converts the signal input thereto to a digital signal.

At a time point t2, a signal TX1 and a signal TX2 shift to high level, thereby turning on the transistors M1 constituting the transfer units 25 to transfer electric charges resulting from photoelectric conversion executed at the PDs 11 through 14 and the PDs 21 through 24 to the corresponding floating diffusions 27 at the pixels 10 (1, 1) through 10 (1, 4) and the pixels 10 (2, 1) through 10 (2, 4).

In addition, at the time point t2, the amplifier units 28 and the pixel 10 (1, 1) and the pixel 10 (2, 1) are electrically connected with each other, and thus, a sum pixel signal generated by averaging signals at the two pixels 10 (1, 1) and 10 (2, 1) is output to the vertical signal line 101*a*. The sum pixel signal output to the vertical signal line 101*a* is a signal corresponding to the average of the potentials at the floating diffusions 27 in the pixel 10 (1, 1) and the pixel 10 (2, 1). Namely, a signal corresponds to the average of the potential based upon the electric charge resulting from photoelectric conversion executed at the PD11 at the pixel 10 (1, 1) and the potential based upon the electric charge resulting from photoelectric conversion executed at the PD21 at the pixel 10 (2, 1).

At the time point t2, a sum pixel signal generated by averaging signals at the two pixels 10 (1, 2) and 10 (2, 2), a sum pixel signal generated by averaging signals at the two pixels 10 (1, 3) and 10 (2, 3) and a sum pixel signal generated by averaging signals at the two pixels 10 (1, 4) and 10 (2, 4) are respectively output to the vertical signal line 101*b* through the vertical signal line 101*d*.

At the time point t2, the sum pixel signal generated by averaging the signals at the two pixels 10 (1, 1) and 10 (2, 1) output to the vertical signal line 101*a*, and the sum pixel signal generated by averaging the signals at the two pixels 10 (1, 2) and 10 (2, 2) output to the vertical signal line 101*b*, are input to the arithmetic operation circuit unit 83*a* where they are added together and averaged. Namely, the arithmetic operation circuit unit 83*a* generates a sum pixel signal representing the average of the signals at the four pixels, i.e., the pixel 10 (1,1), the pixel 10 (2, 1), the pixel 10 (1, 2) and the pixel 10 (2, 2), and outputs the sum pixel signal thus generated to the A/D conversion unit 82*a*. The A/D conversion unit 82*a* then converts the signal input thereto to a digital signal.

Likewise, the sum pixel signal generated by averaging the signals at the two pixels (1, 3) and 10 (2, 3) output to the vertical signal line 101*c*, and the sum pixel signal generated by averaging the signals at the two pixels 10 (1, 4) and 10 (2, 4) output to the vertical signal line 101*d*, are input to the arithmetic operation circuit unit 83*c* where they are added together and averaged. Namely, the arithmetic operation circuit unit 83*c* generates a sum pixel signal representing the average of the signals at the four pixels, i.e., the pixel 10 (1,3), the pixel 10 (2, 3), the pixel 10 (1, 4) and the pixel 10 (2, 4), and outputs the sum pixel signal thus generated to the A/D conversion unit 82*c*. The A/D conversion unit 82*c* then converts the signal input thereto to a digital signal.

During a time period elapsing between a time point t3 and a time point t5, signals generated by adding together and averaging signals generated at the pixel 10 (3, 1), the pixel 10 (3, 2), the pixel 10 (4, 1) and the pixel 10 (4, 2) and signals generated by adding together and averaging signals generated at the pixel 10 (3, 3), the pixel 10 (3, 4), the pixel (4, 3) and the pixel 10 (4, 4) are read out in the same way as signals are read out during the time period elapsing between the time point t1 and the time point t3. During a time period elapsing between the time point t5 and a time point t7, signals generated by adding together and averaging signals at the pixel 10 (5, 1), the pixel 10 (5, 2), the pixel 10 (6, 1) and the pixel 10 (6, 2) and signals generated by adding together and averaging signals generated at the pixel 10 (5, 3), the pixel 10 (5, 4), the pixel 10 (6, 3) and the pixel 10 (6, 4) are read out in the same way as signals are read out during the time period elapsing between the time point t1 and the time point t3. In the above described manner, a signal can be read out by adding together the signals at four pixels present in each region in conjunction with a Bayer array basic unit constituted with the regions 41B through 44B, each made up with 2×2=4 pixels.

Figure 20:
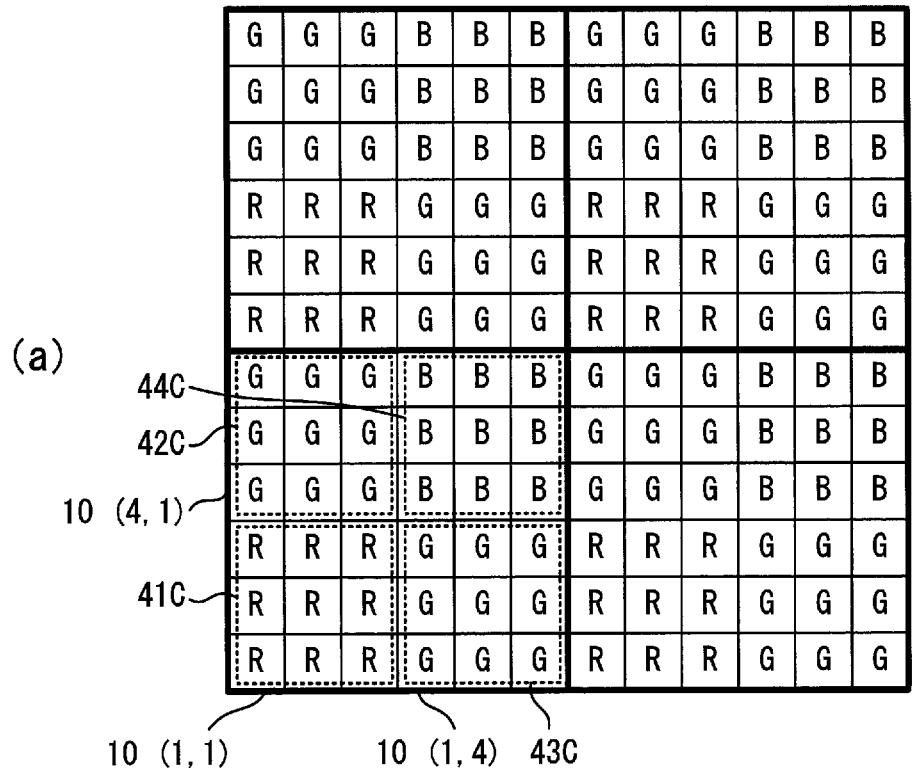
Figure 20:
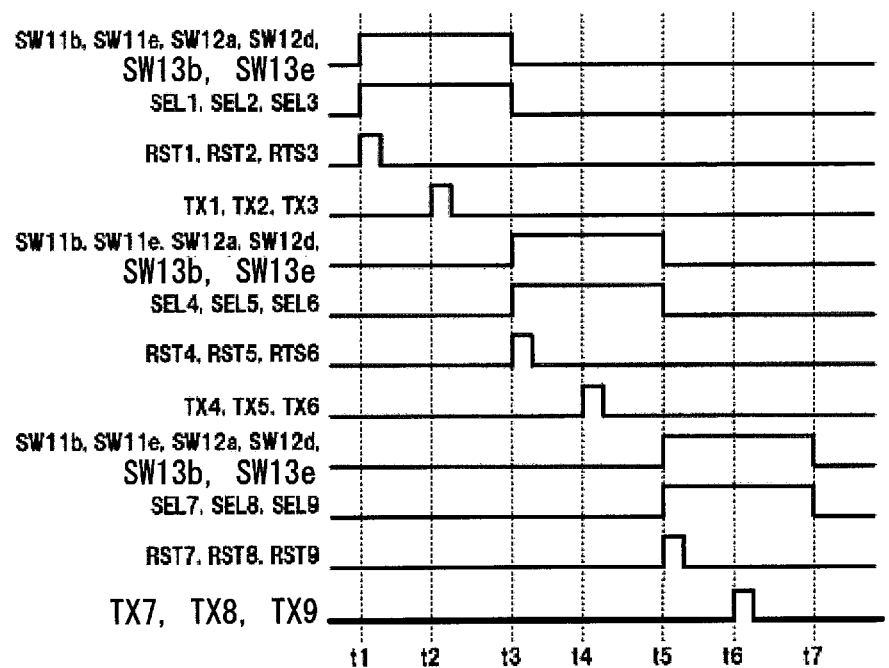

FIG. 20 presents yet another example of an operation that may be executed in the image sensor 3 in variation 2. FIG. 20(*a*) shows a Bayer array reiterating basic unit made up with 6×6 pixels present in regions 41C through 44C. FIG. 20(*b*) is a timing chart of an operation that may be executed in the image sensor 3 when the transmission wavelengths at the filter units 5 are set as shown in FIG. 20(*c*).

At a time point t1, a signal RST1, a signal RST2 and a signal RST3 shift to high level, thereby turning on the transistors M2 constituting the reset units 26 and setting the potentials at the floating diffusions 27 to the reset potential at the pixels 10 (1, 1) through (1, 3), the pixels 10 (2, 1) through 10 (2, 3) and the pixels 10 (3, 1) through 10 (3, 3).

As a signal SEL1, a signal SEL2 and a signal SEL3 shift to high level at the time point t1, the source terminals of the transistors M3 constituting the amplifier units 28 in the pixel 10 (1, 1), the pixel 10 (2, 1) and the pixel 10 (3, 1) become electrically connected with one another via the vertical signal line 101*a*. Thus, a noise signal generated by adding together and averaging signals at the three pixels 10 (1, 1), 10 (2, 1) and 10 (3, 1) is output to the vertical signal line 101*a*.

In addition, as the signal SEL1, the signal SEL2 and the signal SEL3 shift to high level at the time point t1, the amplifier units 28 in the pixel 10 (1, 2), the pixel 10 (2, 2) and the pixel 10 (3, 2) become electrically connected with one another via the vertical signal line 101*a*. Thus, a noise signal generated by adding together and averaging signals at the three pixels 10 (1, 2), 10 (2, 2) and 10 (3, 2) is output to the vertical signal line 101*b*. Likewise, as the signal SEL1, the signal SEL2 and the signal SEL3 shift to high level at the time point t1, a noise signal generated by averaging signals at the three pixels (1, 3), 10 (2, 3) and 10 (3, 3) is output to the vertical signal line 101*c*.

At the time point t1, a signal SW12*a*, a signal SW11*b* and a signal SW13*b* shift to high levels. It is to be noted that s signal SW11*a*, a signal SW13*a*, a signal SW12*b*, a signal SW11*c*, a signal SW12*c* and a signal SW13*c* are each set to low level. As a result, the noise signals output to the vertical signal line 101*a* through the vertical signal line 101*c* are input to the arithmetic operation circuit unit 83*b* where they are added together and averaged. Namely, the arithmetic operation circuit unit 83*b* generates a noise signal representing the average of the signals at the nine pixels, 10 (1,1), 10 (1, 2), 10 (1, 3), 10 (2, 1), 10 (2, 2), 10 (2, 3), 10 (3, 1), 10 (3, 2) and 10 (3, 3), and outputs the noise signal thus generated to the A/D conversion unit 82*b*. The A/D conversion unit 83*b* then converts the signal input thereto to a digital signal.

At a time point t2, a signal TX1, a signal T2X and a signal TX3 shift to high level, thereby turning on the transistors M1 constituting the transfer unit 25, to transfer electric charges resulting from photoelectric conversion executed at the PDs 11 through 13, the PDs 21 through 23 and the PDs 31 through 33, to the corresponding floating diffusions 27 at the pixels 10 (1, 1) through 10 (1, 3) the pixels 10 (2, 1) through 10 (2, 3) and the pixels (3, 1) through 10 (3, 3).

In addition, at the time point t2, a sum pixel signal generated by averaging signals at the three pixels 10 (1,1), 10 (2, 1) and 10 (3, 1) is output to the vertical signal line 101*a*. At the time point t2, a sum pixel signal generated by averaging signals at the three pixels (1, 2), 10 (2, 2) and 10 (2, 3) and a sum pixel signal generated by averaging signals at the three pixels 10 (1, 3), 10 (2, 3) and 10 (3, 3) are respectively output to the vertical signal line 101*b* and the vertical signal line 101*c*.

At the time point t2, the sum pixel signals output to the vertical signal line 101*a* through the vertical signal line 101*c* are input to the arithmetic operation circuit unit 83*b* where they are added together and averaged. Namely, the arithmetic operation circuit unit 83*b* generates a sum pixel signal representing the average of the signals at the nine pixels, and outputs the sum pixel signal thus generated to the A/D conversion unit 82*b*. The A/D conversion unit 82*b* then converts the signal input thereto to a digital signal. In the above described manner, the image sensor 3 is thus able to read out a signal by adding together the signals at nine pixels present in each region in conjunction with a Bayer array basic unit constituted with the regions 41C through 44C, each made up with 3×3=9 pixels.

In this variation, the amplifier units 28 in the plurality of pixels 10 disposed along the column direction are electrically connected with one another via a vertical signal line 101 so allow signals generated in the plurality of pixels 10 to be added together at the vertical signal line 101. Thus, the need for the second switch units 19 via which the signals at a plurality of pixels 10 disposed along the column direction are added together and the wiring for connecting the second switch units 19 to the floating divisions 27 is eliminated. In addition, since the signals generated at the plurality of pixels 10 disposed along the row direction are added together in an arithmetic operation circuit unit 83, the need for the first switch units 18 via which the signals in the plurality of pixels 10 disposed along the row direction are added together and the wiring for connecting the first switch units 18 to the floating divisions 27, is eliminated. Consequently, the pixels can be miniaturized and the chip area of the image sensor can be reduced.

Furthermore, when signals generated at pixels are added together by connecting a plurality of amplifier units 28 with one another, an accurate sum cannot be calculated unless the difference among the signals at the individual pixels 10, to be added together, i.e., the potential differences among the potentials at the floating diffusions 27 in the individual pixels, is small. For instance, if there is a significant difference between the potentials at the floating diffusions 27 in two addition-target pixels, almost all of the electric current from the current source 81 will flow to the amplifier unit 28 in the pixel with the higher level signal, and in such a case, a signal corresponding to the average of the potentials at the two floating diffusions 27 cannot be obtained. In contrast, the regions 41A through 44A, 41B through 44B and 41C through 44C in the variation each contain same-color pixels 10 and thus, the difference among the signals at the individual pixels 10 to be added together is expected to be small. As a result, accurate addition processing can be executed in this variation.

Variation 3

Figure 21:
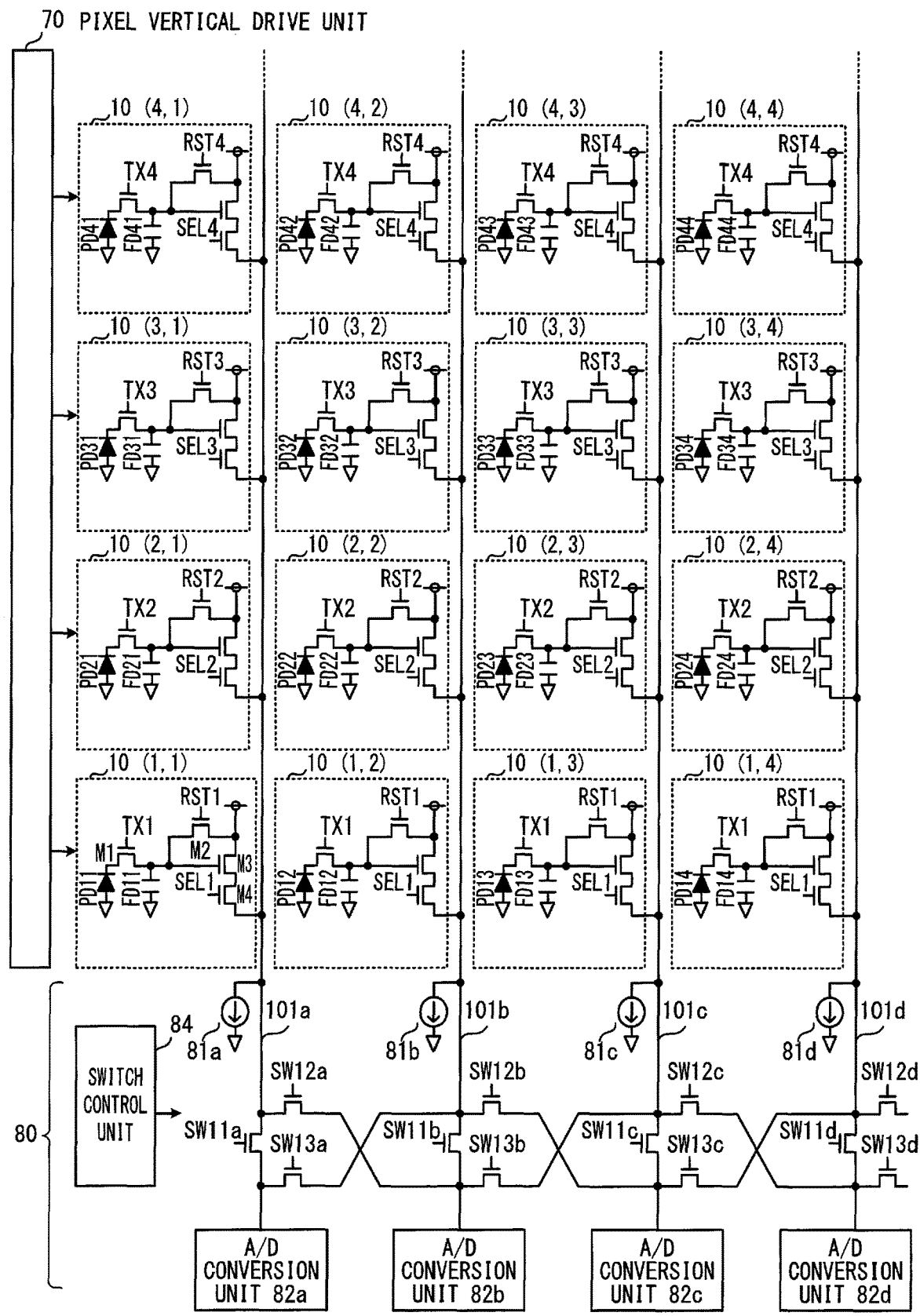

In variation 2, signals generated at a plurality of pixels 10 disposed along the column direction are added together at a vertical signal line 101 and signals generated at a plurality of pixels 10 disposed along the row direction are added together in an arithmetic operation circuit unit 83. As an alternative, signals generated at a plurality of pixels 10 disposed along the column direction and signals generated at a plurality of pixels 10 disposed along the row direction may both be added together at a vertical signal line 101. FIG. 21 is a circuit diagram showing the structure in part of the image sensor 3 in variation 3. The column circuit unit 80 in variation 3 does not include arithmetic operation circuit units 83. Timing charts pertaining to operations that may be executed in the image sensor 3 in variation 3, which would be identical to the timing charts in FIGS. 18 through 20, are not provided and these operations will not be explained in detail. The following explanation will focus on primary differences from the image sensor 3 in variation 2.

At the time point t1 in FIG. 19, a signal SEL1, a signal SEL2, a signal SW11*a* and a signal SW13*a* shift to high level, thereby electrically connecting the amplifier units 28 at the pixel 10 (1, 1), the pixel 10 (1, 2), the pixel 10 (2, 1) and the pixel 10 (2, 2) with one another via the vertical signal lines 101*a* and 101*b*. As a result, a noise signal generated by averaging signals at the four pixels 10 (1, 1), 10 (1, 2), 10 (2, 1) and 10 (2, 2) is output to the A/D conversion unit 82*a* where it is converted to a digital signal. Likewise, as a signal SW11*c* and a signal SW13*c* shift to high level at the time point t1, a noise signal generated by averaging signals at the four pixels 10 (1, 3), 10 (2, 3), 10 (1, 4) and 10 (2, 4) is output to the A/D conversion unit 82*c* which then converts it to a digital signal.

At the time point t2 in FIG. 19, a signal TX1 and a signal TX2 shift to high level and a sum pixel signal generated by averaging signals at the four pixels 10 (1, 1), 10 (1, 2), 10 (2, 1) and 10 (2, 2) is output to the A/D conversion unit 82*a* where it is converted to a digital signal. Likewise, at the time point t2, a sum pixel signal generated by averaging signals at the four pixels 10 (1, 3), 10 (2, 3), 10 (1, 4) and 10 (2, 4) is output to the A/D conversion unit 82*c* which then converts it to a digital signal.

During the period of time elapsing between the time point t3 and the time point t5 in FIG. 19, signals generated by adding together and averaging signals generated at the pixel 10 (3, 1), the pixel 10 (3, 2), the pixel 10 (4, 1) and the pixel 10 (4, 2) and signals generated by adding together and averaging signals generated at the pixel 10 (3, 3), the pixel 10 (3, 4), the pixel 10 (4, 3) and the pixel 10 (4, 4) are read out in the same way as in the signal readout executed during the time period elapsing between the time point t1 and the time point t3. During the period of time elapsing between the time point t5 and the time point t7, signals generated by adding together and averaging signals generated at the pixel 10 (5, 1), the pixel 10 (5, 2), the pixel 10 (6, 1) and the pixel 10 (6, 2) and signals generated by adding together and averaging signals generated at the pixel 10 (5, 3), the pixel 10 (5, 4), the pixel 10 (6, 3) and the pixel 10 (6, 4) are read out in the same way as the signal readout executed during the time period elapsing between the time point t1 and the time point t3.

At the time point t1 in FIG. 20, a signal SEL1, a signal SEL2, a signal SEL3, a signal SW12*a*, a signal SW11*b* and a signal SW13*b* shift to high level. In response, the amplifier units 28 at the pixel 10 (1, 1), the pixel 10 (1, 2), the pixel 10 (1, 3), the pixel 10 (2, 1), the pixel 10 (2, 2), the pixel 10 (2, 3), the pixel 10 (3, 1), the pixel 10 (3, 2) and the pixel 10 (3, 3) become electrically connected with one another via the vertical signal lines 101*a*, 101*b* and 101*c*. As a result, a noise signal generated by averaging signals at the nine pixels 10 (1, 1), 10 (1, 2), 10 (1, 3), 10 (2, 1), 10 (2, 2), 10 (2, 3),

10 (3, 1), 10 (3, 2) and (3, 3) is output to the A/D conversion unit 82b where it is converted to a digital signal.

At the time point t2 in FIG. 20, a signal TX1, a signal TX2 and a signal TX3 shift to high level. As a result, a sum pixel signal generated by averaging signals at the nine pixels 10 (1, 1), 10 (1, 2), 10 (1, 3), 10 (2, 1), 10 (2, 2), 10 (2, 3), 10 (3, 1), 10 (3, 2) and (3, 3) is output to the A/D conversion unit 82b, which then converts it to a digital signal.

In variation 3 described above, in conjunction with the Bayer array basic unit constituted with the regions 41B through 44B each containing 2×2=4 pixels, signals generated at the four pixels in each region are added together at a vertical signal line 101. In variation 3 described above, in conjunction with the Bayer array basic unit constituted with the regions 41C through 44C each containing 3×3=9 pixels, signals generated at the nine pixels in each region are added together at a vertical signal line 101. As a result, the need for arithmetic operation circuit units 83 used for adding together signals generated in a plurality of pixels 10 disposed along the row direction is eliminated. Consequently, the chip area of the image sensor can be reduced.

Variation 4

In the embodiments and the variations thereof described above, the filter units 5 each include three filters constituted with an EC layer 21 that produces Mg (magenta) color, an EC layer 22 that produces Ye (yellow) color and an EC layer 23 that produces Cy (cyan) color. As an alternative, the filter units 5 may be configured so that they each include three filters constituted with an EC layer that produces R (red) color, an EC layer that produces G (green) color and an EC layer that produces B (blue) color. In addition, the filter units 5 may be variable filters constituted of liquid crystal.

Variation 5

In the embodiments and the variations thereof described above, R pixels, G pixels and B pixels are formed by controlling the filter units 5 of the individual pixels 10. As an alternative, the filter units 5 at the pixels 10 may be controlled so as to form W pixels, each having a W (white) filter unit 5, and BK pixels each having a BK (black) filter unit 5. In such a case, the size of a region where W pixels with W (white) filter units 5 are present and the size of a region where BK pixels with BK (black) filter units 5 are present may be individually altered.

Variation 6

In the embodiments and the variations thereof described above, the photoelectric conversion units are each constituted with a photodiode. As an alternative, photoelectric conversion units each constituted with a photoelectric conversion film may be used.

Variation 7

The image sensor 3 in the embodiments and the variations thereof is a back-illuminated image sensor. As an alternative, the image sensor 3 may be configured as a front-illuminated image sensor having a wiring layer 210 disposed on the entry surface side where light enters.

Variation 8

The image sensor 3 having been described in reference to the embodiments and the variations thereof may be adopted in a camera, a smart phone, a tablet, a built-in camera in a PC, an on-vehicle camera, a camera installed in an unmanned aircraft (such as a drone or a radio-controlled airplane) and the like.

While the present invention has been described in reference to various embodiments and variations thereof, the present invention is not limited to the particulars of these examples. Any other mode conceivable within the scope of the technical teaching of the present invention is within the scope of the present invention.

The disclosures of the following priority applications are herein incorporated by reference:

Japanese Patent Application No. 2016-192249 filed Sep. 29, 2016

Japanese Patent Application No. 2017-61131 filed Mar. 27, 2017

REFERENCE SIGNS LIST

3 image sensor, 5 filter unit, 10 pixel, 34 photoelectric conversion unit, 60 filter control unit.

The invention claimed is:

1. An image sensor comprising:
   a first filter that transmits and adjusts wavelength ranges of light;
   a second filter that transmits and adjusts wavelength ranges of light;
   a first photoelectric conversion unit that converts light transmitted through the first filter to a first electric charge;
   a second photoelectric conversion unit that converts light transmitted through the second filter to a second electric charge;
   a first accumulating unit that accumulates the first electric charge generated by the first photoelectric conversion unit;
   a second accumulating unit that accumulates the second electric charge generated by the second photoelectric conversion unit;
   a first output unit that outputs a first signal generated based upon the first electric charge accumulated by the first accumulating unit;
   a second output unit that outputs a second signal generated based upon the second electric charge accumulated by the second accumulating unit;
   a connecting unit that selectively electrically connects the first accumulating unit and the second accumulating unit to each other;
   a filter control unit that changes transmission wavelength ranges of the first filter and the second filter, respectively; and
   a control unit that controls an electrical connection state of the connecting unit, wherein:
   the first filter and the second filter are arranged adjacent to each other,
   the control unit controls the connecting unit to be in an electrically disconnected state, based on the filter control unit controlling the first filter and the second filter to transmit light of different wavelength ranges, and
   the control unit controls the connecting unit to be in an electrically connected state, based on the filter control unit controlling the first filter and the second filter to transmit light of a same wavelength range.

2. The image sensor according to claim 1, wherein:
   the first filter and the second filter are adjacent to each other in a column direction of the image sensor.

3. The image sensor according to claim 1, wherein:
   the first filter and the second filter are adjacent to each other in a row direction of the image sensor.

4. The image sensor according to claim 1, wherein:
   the first filter has a plurality of filter layers;
   the second filter has a plurality of filter layers; and
   the first photoelectric conversion unit converts the light transmitted through each of the filter layers in the first filter to the first electric charge, and the second photoelectric conversion unit converts the light transmitted through each of the filter layers in the second filter to the second electric charge.

5. An electronic camera comprising:

the image sensor according to claim 1; and circuitry that generates image data based on a signal provided by the image sensor.

6. The electronic camera according to claim 5, wherein:

the electronic camera has a first mode and a second mode, and the control unit (i) controls the connecting unit to be in the electrically disconnected state in the first mode, based on the filter control unit controlling the first filter and the second filter to transmit light of different wavelength ranges, and (ii) controls the connecting unit to be in the electrically connected stated in the second mode, based on the filter control unit controlling the first filter and the second filter to transmit light of the same wavelength range.

7. The electronic camera according to claim 6, wherein:

the first mode is a still image photographing mode, and the second mode is a movie shooting mode.

8. The electronic camera according to claim 6, wherein:

the first mode is a shooting mode at a first zoom magnification, and the second mode is a shooting mode at a second zoom magnification different from the first zoom magnification.

* * * * *